US012751193B2

(12) United States Patent
Jeon

(10) Patent No.: US 12,751,193 B2
(45) Date of Patent: Sep. 29, 2026

(54) ORGANIC LIGHT EMITTING DISPLAY DEVICE AND MANUFACTURING METHOD THEREOF

(71) Applicant: LG DISPLAY CO., LTD., Seoul (KR)

(72) Inventor: Sehwan Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 375 days.

(21) Appl. No.: 18/388,911

(22) Filed: Nov. 13, 2023

(65) Prior Publication Data

US 2024/0196716 A1 Jun. 13, 2024

(30) Foreign Application Priority Data

Dec. 7, 2022 (KR) ........................ 10-2022-0169680

(51) Int. Cl.

*H10K 59/80* (2023.01)
*H10K 71/00* (2023.01)
*H10K 71/80* (2023.01)
*H10K 77/10* (2023.01)

(52) U.S. Cl.

CPC ......... *H10K 59/8792* (2023.02); *H10K 71/80* (2023.02); *H10K 71/851* (2023.02); *H10K 77/111* (2023.02)

(58) Field of Classification Search

None

See application file for complete search history.

(56) References Cited

U.S. PATENT DOCUMENTS

2009/0008142 A1* 1/2009 Shimizu ................. H05K 1/036 428/209
2016/0064685 A1* 3/2016 Kim ...................... B32B 37/003 428/137
2022/0139274 A1* 5/2022 Sim ...................... H10K 50/865 361/679.01

FOREIGN PATENT DOCUMENTS

KR 20160025152 A 3/2016
KR 10-2021-0083546 A 7/2021
KR 20220061305 A 5/2022

OTHER PUBLICATIONS

Machine-generated English translation of KR-20210083546 (Year: 2021).*
Office Action in Korean Appln. No. 10-2022-0169680, mailed on Nov. 3, 2025, 19 pages (with English translation).

* cited by examiner

*Primary Examiner* — Bo B Jang
(74) *Attorney, Agent, or Firm* — Fish & Richardson P.C.

(57) ABSTRACT

An organic light-emitting display device and manufacturing method thereof is capable of preventing the stretching of the organic light-emitting display device through a rolling process of attaching a support film.

18 Claims, 26 Drawing Sheets

ORGANIC LIGHT EMITTING DISPLAY DEVICE AND MANUFACTURING METHOD THEREOF

CROSS-REFERENCE TO RELATED APPLICATIONS

The present application claims the priority of Korean Patent Application No. 10-2022-0169680, filed on Dec. 7, 2022, which is hereby incorporated by reference in its entirety.

BACKGROUND

Field of the Disclosure

The present disclosure relates to an organic light-emitting display device and manufacturing method thereof that is capable of preventing the stretching of the organic light-emitting display device through a rolling process of attaching a support film.

BACKGROUND

Recently, rapid advance of the field of displays for representing electrical information signals visually has led to developments of various display apparatuses with excellent performance in terms of compactness, lightweight, and low power consumption.

In particular, organic light-emitting display devices have the advantage of being able to be manufactured with thin thicknesses and using flexible substrates. Organic light-emitting display devices fabricated with flexible substrates may be utilized as rollable, stretchable, and bendable display devices.

To enhance the rigidity of organic light-emitting display devices incorporating flexible substrates, a stiffening auxiliary component called a backplate (support film) is attached. The rolling process used to attach the backplate may lead to errors in subsequent processes, such as the attachment of the polarizing plate and the flexible printed circuit board (FPCB).

SUMMARY

The present disclosure has been conceived to solve the aforementioned problem in the related technical field, and the present disclosure aims to prevent errors in the processes of attaching the polarizing plate and the flexible printed circuit board.

An organic light-emitting display device including a display area, a bending area, and a pad area according to an aspect of the present disclosure includes a flexible substrate, a pixel array layer disposed on the upper surface of the flexible substrate, an adhesive layer and backplate disposed on the lower surface of the flexible substrate, a polarizing plate disposed on the upper surface of the pixel array layer, and a flexible printed circuit board attached to the pad area, wherein the backplate includes a mesh pattern inserted into the interior thereof.

A method of manufacturing an organic light-emitting display device according to an aspect of the present disclosure includes forming a flexible substrate on a mother substrate, forming a pixel array layer on the flexible substrate, separating the mother substrate, attaching a support film including a mesh pattern to the flexible substrate, attaching, after forming the support film, a polarizing plate and a flexible printed circuit board, and bending the organic light-emitting display device.

According to the present disclosure, it is possible to eliminate or minimize the problem of the stretching of the support film that is caused by the pressure exerted by the roller during the process of attaching the support film.

According to the present disclosure, it is possible to eliminate or minimize the problem of the stretching of the flexible substrate during the process of attaching the support film.

According to the present disclosure, it is possible to prevent the issue of misalignment in the attachment position of the polarizing plate and the flexible printed circuit board.

According to the present disclosure, it is possible to enhance the heat dissipation performance of organic light-emitting display devices.

According to the present disclosure, it is possible to eliminate the issue of the mesh pattern being visible to the naked eye.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
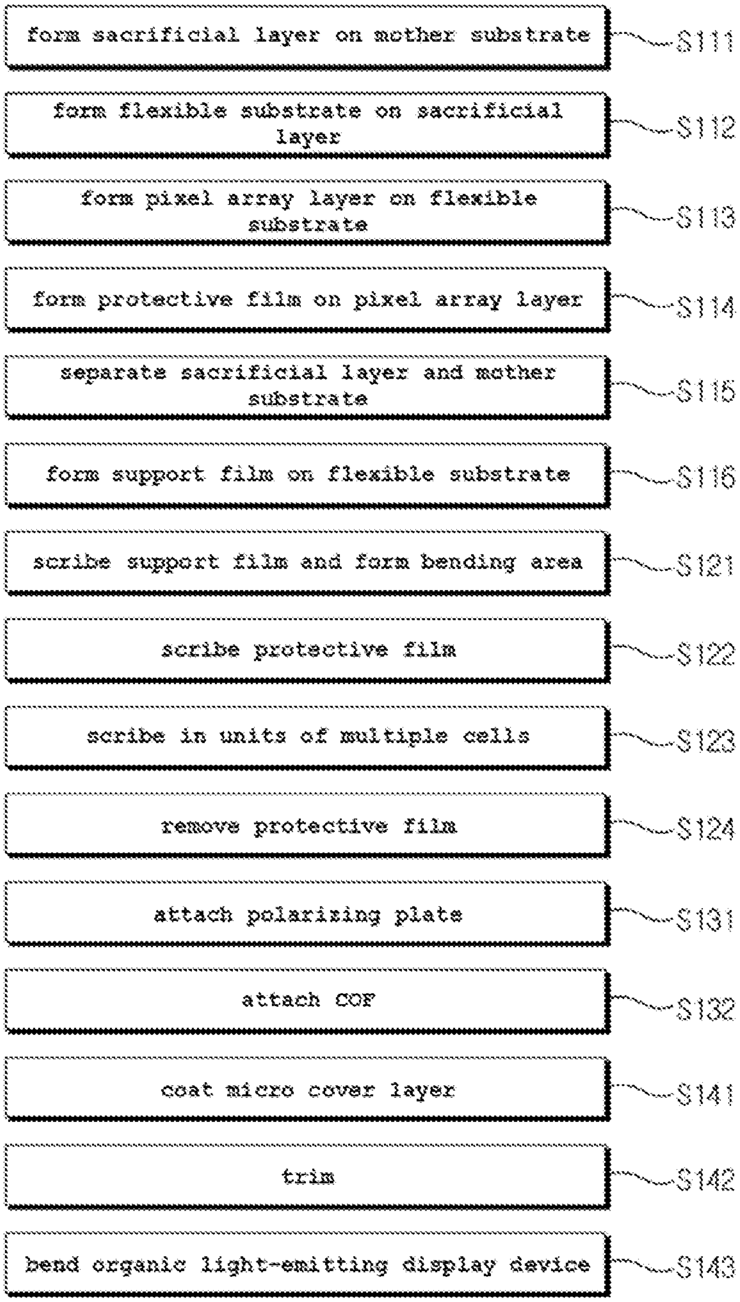
FIG. 1 is a flowchart illustrating a method of manufacturing an organic light-emitting device according to an aspect of the present disclosure.

Advantages and features of the present disclosure and methods of accomplishing the same may be understood more readily by reference to the following detailed description of embodiments and the accompanying drawings. The present disclosure may, however, be embodied in many different forms and should not be construed as being limited to the exemplary embodiments set forth herein; rather, these exemplary embodiments are provided so that the present disclosure will be thorough and complete and will fully convey the concept of the disclosure to those skilled in the art, and the present disclosure will only be defined by the appended claims.

The shapes, sizes, ratios, angles, numbers and the like illustrated in the drawings to describe embodiments of the present disclosure are merely exemplary, and thus, the present disclosure is not limited thereto. Throughout the specification, the same reference numerals refer to the same components. In addition, detailed descriptions of well-known technologies may be omitted in the present disclosure to avoid obscuring the subject matter of the present disclosure. When terms such as "comprises," "has," "includes," or "is made up of" are used in this specification, it should be understood that unless "only" is specifically used, additional elements or steps may be included. Unless otherwise explicitly stated, when a component is expressed in the singular form, it is intended to encompass the plural form as well.

In interpreting the components, it is construed to include a margin of error even in the absence of explicit description.

When describing the positional relationship, for example, when the relationship between two parts is described as "on", "on top of", "underneath", "beside", etc., unless "directly" or "immediately" is used, one or more other parts may be located between the two parts.

When a device or layer is referred to as being "on" another device or layer, it includes cases where one device or layer is directly located on the other device or layer or still other device or layer is interposed between the two devices or layers.

Although the terms "first", "second", and the like are used to describe various components, these components are not limited by these terms. These terms are merely used for distinguishing one component from the other components. Therefore, the first component mentioned hereinafter may be the second component in the technical sense of the present disclosure.

Throughout the specification, the same reference numerals refer to the same components.

The sizes and thicknesses of each component shown in the drawings are presented for the convenience of description and are not intended to limit the present disclosure.

The features of various embodiments of the present disclosure may be combined or assembled, either partially or entirely, in various technical manners such as interlocking and interoperations obvious to those skilled in the art, and each aspect may be independently implemented or in conjunction with related embodiments.

Hereinafter, detailed descriptions are made of the embodiments of the present disclosure with reference to the accompanying drawings.

FIG. 1 is a flowchart illustrating a method of manufacturing an organic light-emitting device according to an aspect of the present disclosure. FIGS. 2 to 25 are diagrams illustrating organic light-emitting display devices according to embodiments of the present disclosure.

With reference to FIG. 1, a sacrificial layer 111 is on a mother substrate 110 at step S111.

The mother substrate 110 is a substrate used to support the components arranged on the flexible substrate 120 during the process of manufacturing organic light-emitting display device. The mother substrate 110 may be made of a rigid material. For example, the mother substrate 110 may be made of glass, but is not limited thereto.

Figure 2:
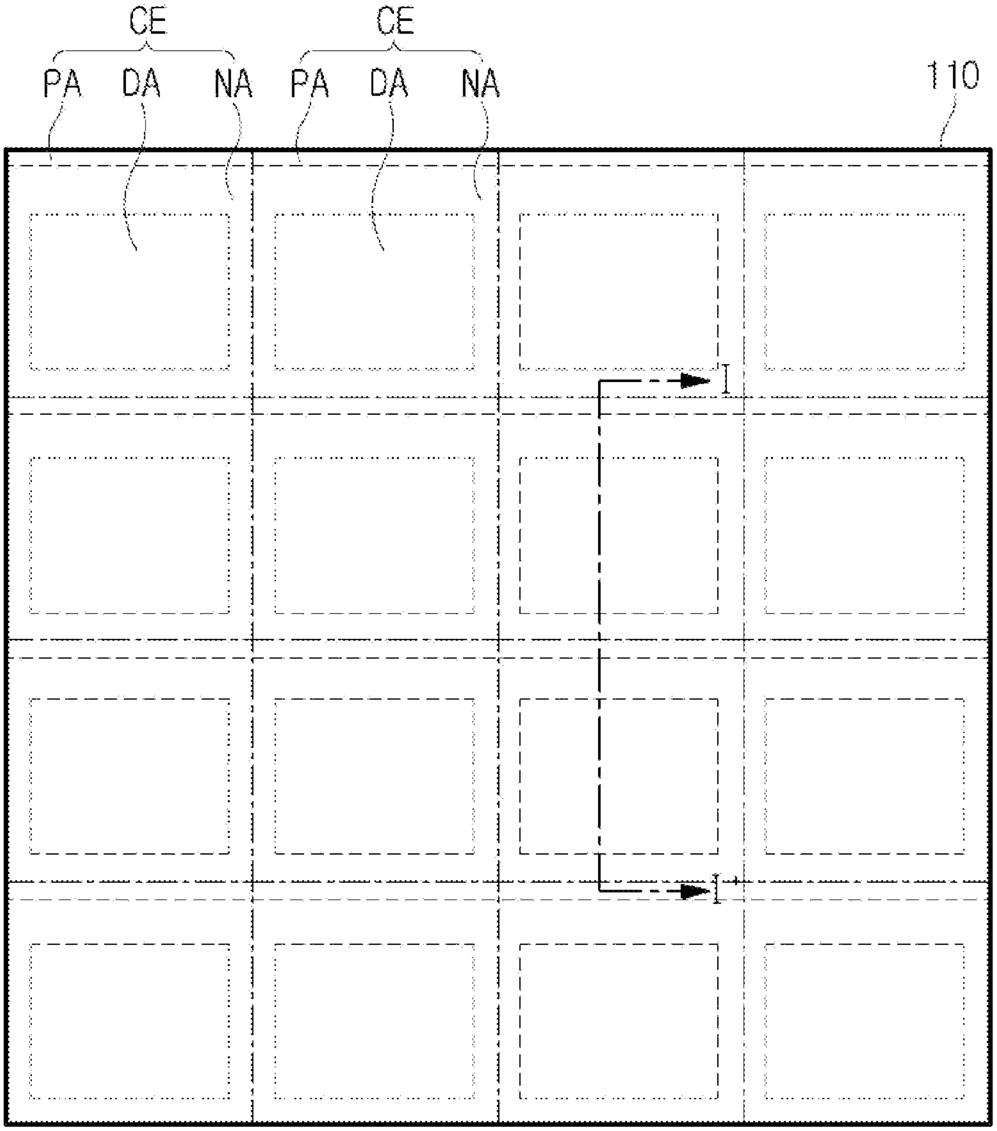
FIG. 2 is a plan view illustrating an organic light-emitting display device according to an aspect of the present disclosure.

With reference to FIG. 2, the mother substrate 110 is a substrate used to fabricate a plurality of organic light-emitting display devices simultaneously. A plurality of cells CE is defined on the mother substrate 110. Each cell CE corresponds to each of the organic light-emitting display devices. Although FIG. 2 depicts 16 cells CE defined on a single mother substrate 110, it is merely an example and not a limitation.

Each of the plurality of cells CE includes a display area DA, a non-display area NA, and a pad area PA. The display area DA is the region where organic light-emitting components are arranged and where the image is displayed. The display area DA is located at the center of each cell CE. The display area DA includes circuitry such as thin-film transistors and capacitors. The non-display area NA is an area where images are not displayed, surrounding the display area DA. Circuitry including thin-film transistors and capacitors may also be placed in the non-display area NA.

The pad area PA is the area where pads are arranged to electrically connect the flexible printed circuit board. The flexible printed circuit board may include chip on film (COF). The flexible printed circuit board may include a data driving unit in the form of an integrated circuit (IC) chip internally. The pad area PA extends from one side of the non-display area NA.

Figure 3:
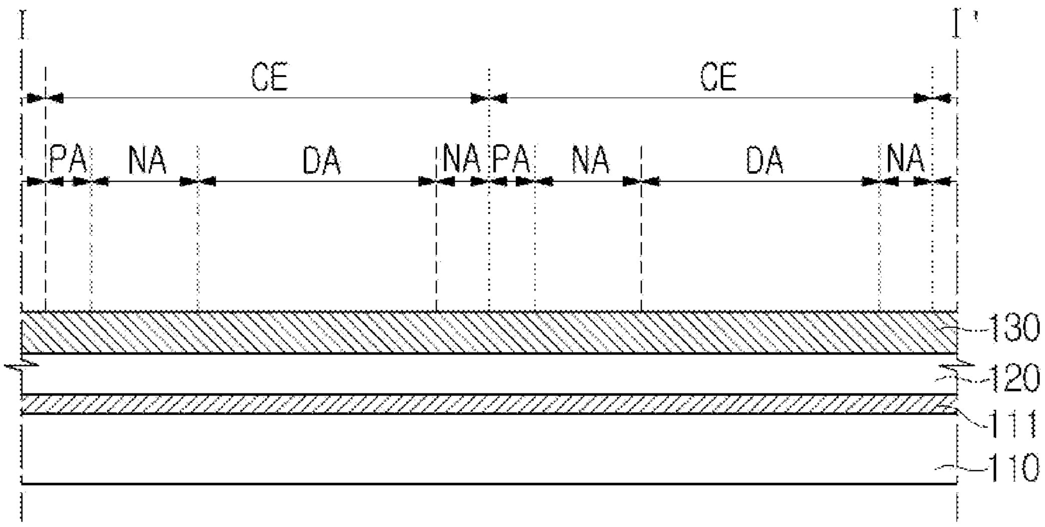
FIG. 3 is a cross-sectional view illustrating an organic light-emitting display device according to the present disclosure.

FIG. 3 is a cross-sectional view of the mother substrate 110 of FIG. 2 taken along line I-I'. With reference to FIG. 3, a sacrificial layer 111 is formed on the mother substrate 110. The sacrificial layer 111 may be made of a material that, when irradiated with a laser, undergoes a weakening of interfacial bonds, thereby reducing the adhesion strength between the sacrificial layer 111 and the flexible substrate 120. The sacrificial layer 111 may be formed, for example, with silicon nitride (SiNx), silicon oxide (SiOx), or a stacked structure of thereof. The sacrificial layer 111 may be formed by depositing silicon nitride and silicon oxide on the entire surface of the mother substrate 110.

With reference to FIG. 1, the flexible substrate 120 is formed on the sacrificial layer 111 at step S112. With reference to FIG. 3, the flexible substrate 120 serves to support various components of the organic light-emitting display device. The flexible substrate 120 may be made of a flexible plastic material. For example, the flexible substrate 120 may be formed from materials such as polyimide (PI) or photoacrylic (photo acryl). In the case of being made of polyimide (PI), the flexible substrate 120 may be formed using a squeeze method.

With reference to FIG. 1, a pixel array layer 130 is formed on the flexible substrate 120 at step S113. With reference to FIG. 3, the pixel array layer 130 includes a circuitry portion and a display portion including the organic light-emitting devices. In FIG. 3, the pixel array layer 130 is depicted as a single layer for the convenience of illustration. With reference to FIGS. 2 and 3, the circuitry portion is formed in the display area DA and the non-display area NA of each cell CE. In the display area DA of each cell CE, thin-film transistors, capacitors, and wiring are formed. For example, the circuitry portion including driving thin-film transistors, switching thin-film transistors, storage capacitors, and other components may be formed in the display area DA. Additionally, in the non-display area NA of each cell CE, a gate driving unit such as gate in panel (GIP) may also be formed. The organic light-emitting device may include an anode, an organic layer on top of the anode, and a cathode on top of the organic layer, which are electrically connected to the driving thin-film transistor. The organic layer may include various sub-layers such as a hole injection layer, a hole transport layer, an organic light-emitting layer, an electron transport layer, and electron injection layer. Although not shown in FIG. 3, the pixel array layer 130 may include an encapsulation layer. The encapsulation layer is a layer designed to protect moisture-sensitive organic light-emitting components from exposure to moisture. The encapsulation layer may be formed by alternately stacking inorganic and organic layers.

Figure 4:
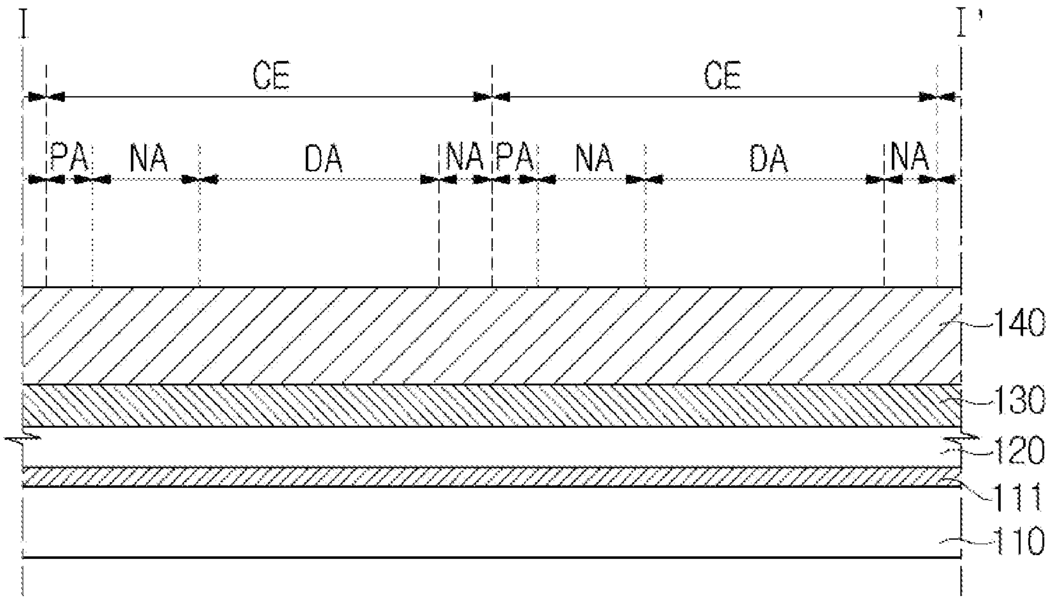
FIG. 4 is a cross-sectional view illustrating an organic light-emitting display device according to the present disclosure.

With reference to FIG. 1, a protective film 140 is formed on the pixel array layer 130 at step S114. With reference to FIG. 4, the protective film 140 is disposed on top of the pixel array layer 130. The protective film 140 serves to protect the display portion and the circuitry portion during the manufacturing process of the organic light-emitting display device. The protective film 140 is removed after the organic light-emitting display device is fabricated. The protective film 140 is positioned to cover the entire surface of the mother substrate 110. The protective film 140 may include a base film and an adhesive layer positioned on one side of the base film. The base film is a film made of plastic material capable of supporting the adhesive layer. The base film may be made of materials such as polyethylene terephthalate (PET). The adhesive layer of the protective film 140 may be made of a material with adhesive properties. Although not shown in FIG. 4, the protective film 140 may also include a release film. The release film is used to prevent the adhesive layer from being exposed to the outside before the manufacturing process, and the adhesive layer of the protective film 140 may be exposed by removing the release film.

Figure 5:
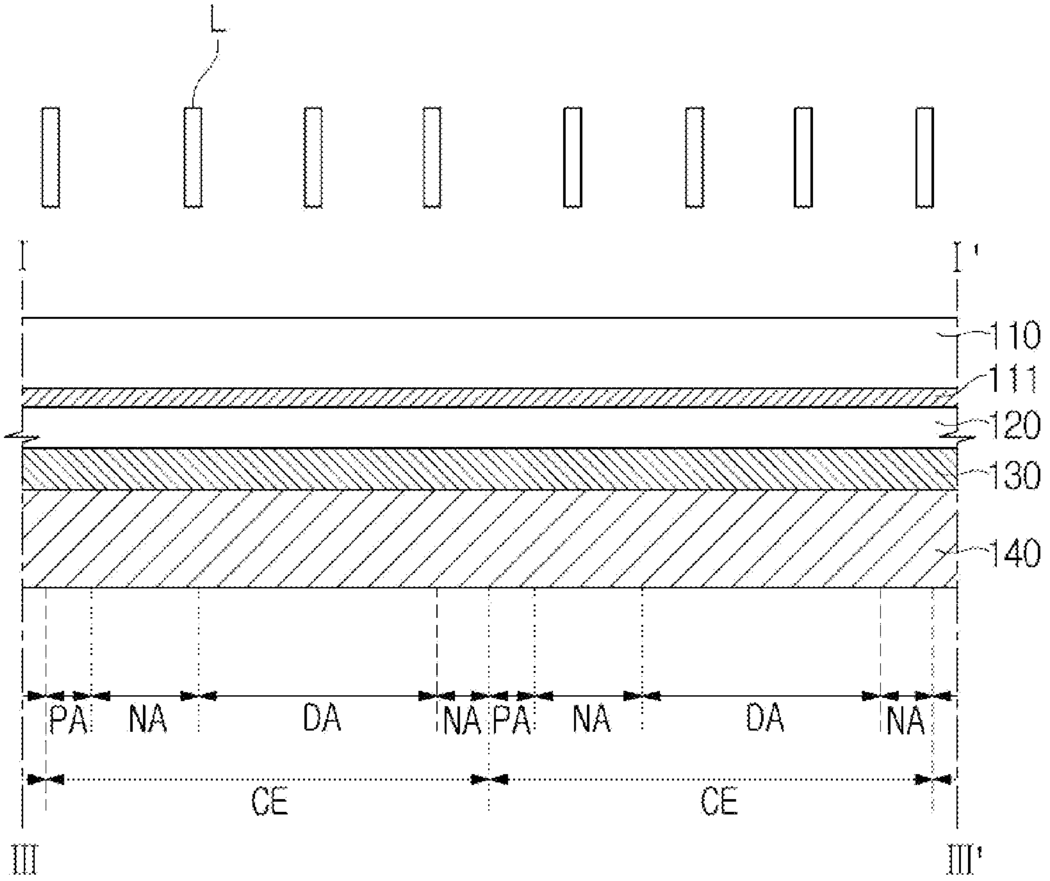
FIG. 5 is a cross-sectional view illustrating an organic light-emitting display device according to the present disclosure.
Figure 6:
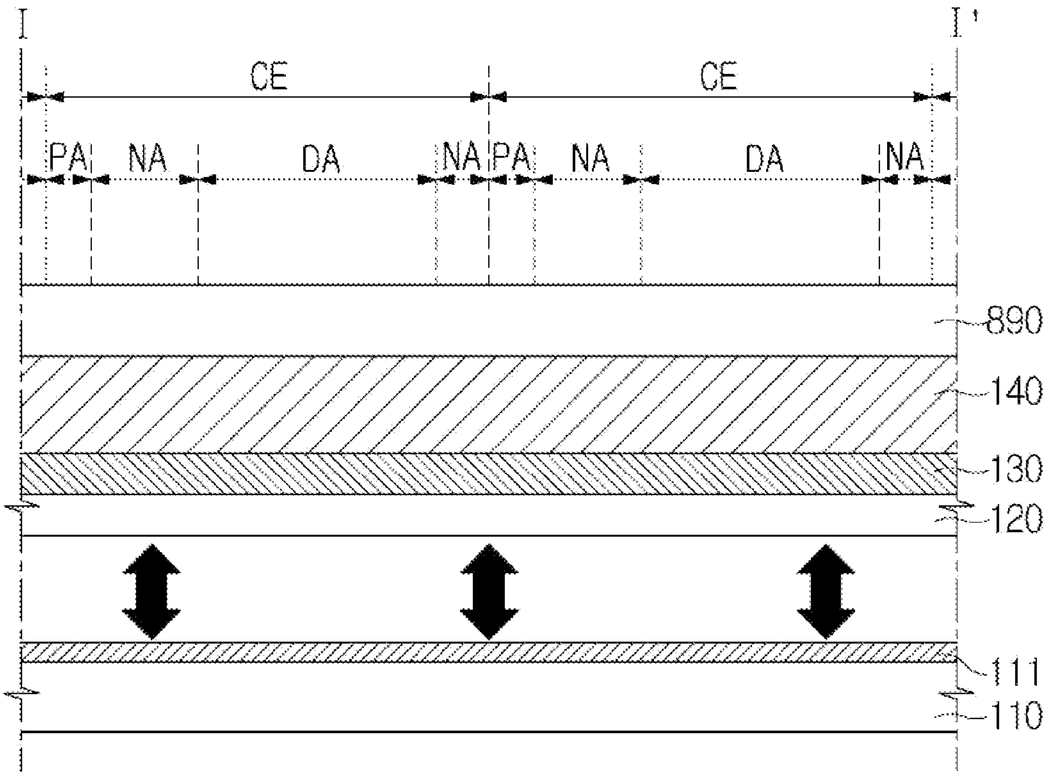
FIG. 6 is a cross-sectional view illustrating an organic light-emitting display device according to the present disclosure.

With reference to FIG. 1, the sacrificial layer 111 and mother substrate 110 are separated from the flexible substrate 120 at step S115. A description thereof is made with reference to FIGS. 5 and 6. With reference to FIG. 5, a laser L irradiates the laser on the backside of the mother substrate 110. In detail, the laser L irradiate the laser on the surface of the mother substrate 110 where the sacrificial layer 111 is formed. The laser L may be a laser used for irradiating ultraviolet (UV) light. The Laser L may irradiate laser to weaken the adhesion strength between the sacrificial layer 111 and the flexible substrate 120. Therefore, as shown in FIG. 6, the sacrificial layer 111 and the substrate 110 may be separated from the flexible substrate 120. In detail, the adhesive layer of the protective film 140 is used to attach the protective film 140 to the attachment stage 890. After positioning the attachment stage 890 facing upward, it is possible to separate the sacrificial layer 111 and the mother substrate 110.

Figure 7:
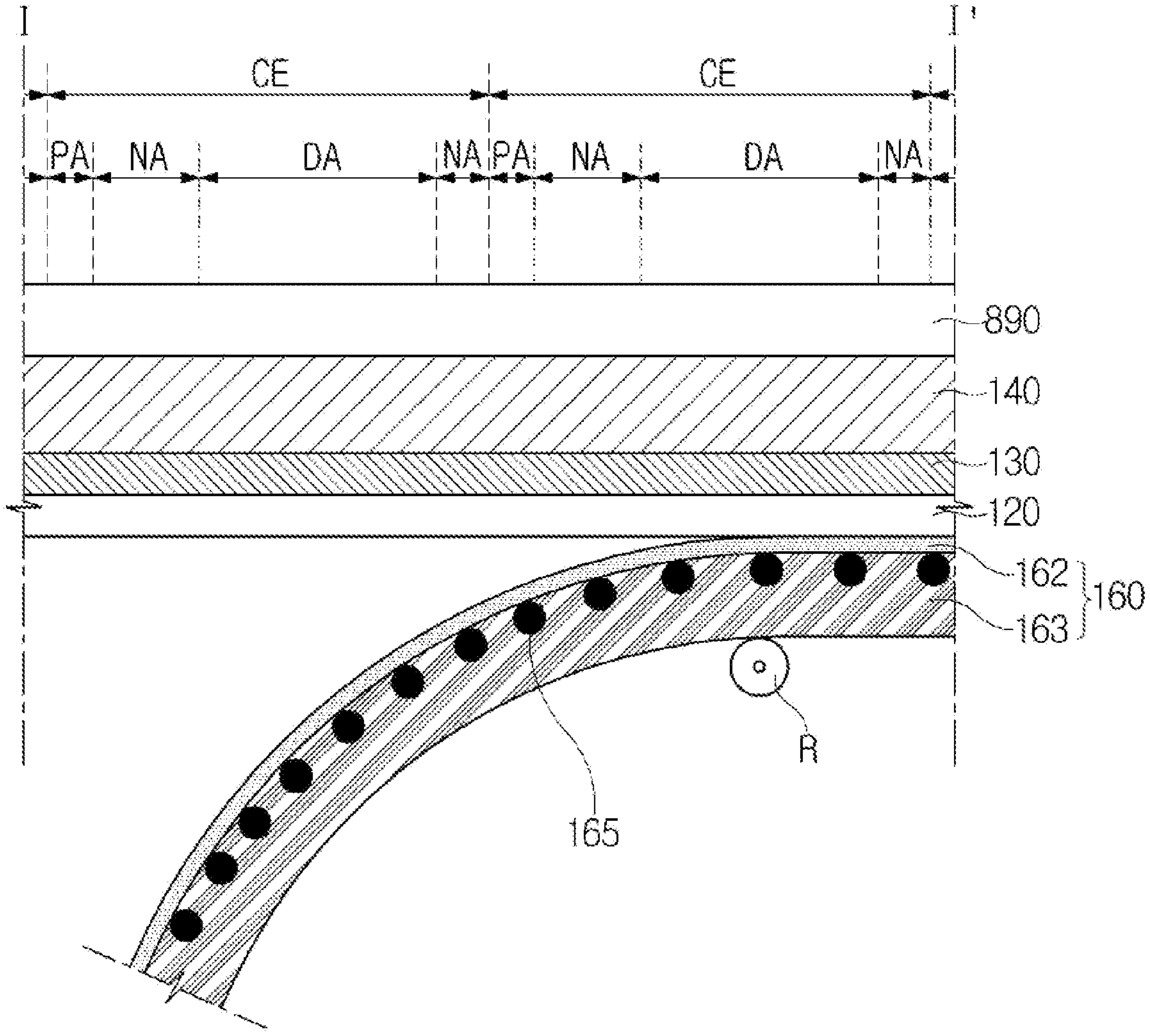
FIG. 7 is a cross-sectional view illustrating an organic light-emitting display device according to the present disclosure.

With reference to FIG. 1, a support film 160 is formed on the flexible substrate 120 at step S116. With reference to FIG. 7, the support film 160 is attached to the backside of the flexible substrate 120. The support film 160 includes components such as an adhesive layer 162, a backplate 163, and a mesh pattern 165. The adhesive layer 162 may be made of a material with adhesive properties. For example, the adhesive layer 162 may be made of a Pressure Sensitive Adhesive (PSA) material. Using the adhesive strength of the adhesive layer 162, the support film 160 may be attached to the backside of the flexible substrate 120. According to the present disclosure, the flexible substrate 120 may be made of a plastic material with low rigidity. Such a flexible substrate 120 allows for bending, rolling, stretching, and the like. However, the flexible substrate 120 has low rigidity and durability. The backplate 163 may be made of a material capable of compensating for rigidity. For example, the backplate 163 may be made of a material such as polyethylene terephthalate (PET). The mesh pattern 165 may be formed to be inserted inside the backplate 163. With reference to FIG. 7, the support film 160 may be attached using a roller R while the backside of the flexible substrate 120 is positioned facing downwards.

It is worth noting that, according to the present disclosure, the process of attaching the support film 160 at step S116 precedes the process of attaching the polarizing plate at step S131 and the process of attaching the flexible printed circuit board at step S132. When attaching the support film 160 using the roller R, the compressive force exerted by the roller R may cause the support film 160 to stretch in the rolling direction. The stretching of the support film 160 may lead to a problem of also stretching (i.e., elongating) the layers on top thereof in the rolling direction. For example, during the rolling process at step S116, the support film 160, flexible substrate 120, and pixel array layer 130 may stretch in the rolling direction (left-right direction). This stretching may lead to misalignment issues between the desired positions of the subsequently attached polarizing plate and flexible printed circuit board. Such misalignment may compromise the functionality of the polarizing plate and result in inaccurate attachment of the flexible printed circuit board to the pads. According to the present disclosure, the proposed support film 160, which includes the mesh pattern 165 inside, may significantly reduce or eliminate the stretching caused by the rolling process during the attachment of the support film 160.

Contrary to the present disclosure, when the rolling process of attaching the support film 160 is performed after the attachment of the polarizing plate and the flexible printed circuit board, there may be no misalignment issue of between the polarizing plate and the flexible printed circuit board. This is because the attachment of the polarizing plate and the flexible printed circuit board has already been completed before the rolling process, even if the support film 160 or other components stretch during the rolling process. The present disclosure is capable of solving the misalignment problem, despite performing the rolling process of attaching the support film before the processes of attaching the polarizing plate and the flexible printed circuit board.

A detailed description is made of the support film 160 proposed in the present disclosure with reference to FIGS. 8 to 13.

FIGS. 8 to 13 are diagrams illustrating the support film according to the present disclosure. The support film 7 includes an adhesive layer 162, a backplate 163, and a mesh pattern 165 as shown in FIG. 7. The adhesive layer 162 may be omitted in some drawings to help describe the support film 160 in detail. For example, FIGS. 8 to 10, 12, and 13 depict merely the backplate 163 and mesh pattern 165.

Figure 8:
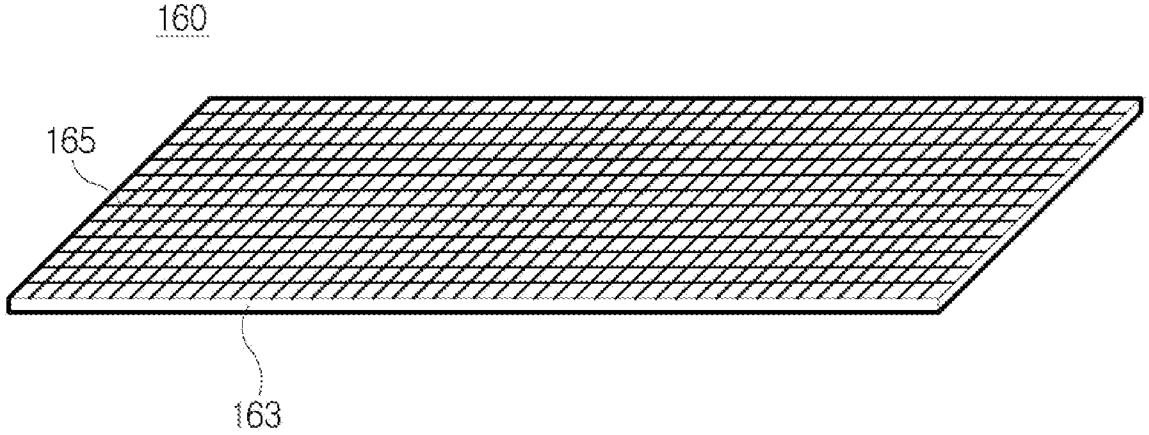
FIG. 8 is a perspective view illustrating a support film according to the present disclosure.

With reference to FIG. 8, the backplate 163 may be formed in a rectangular shape, extending in the horizontal and vertical directions. FIG. 8 depicts that the length in the horizontal direction is greater than the length in the vertical direction, but the configuration is not limited thereto and may vary depending on the form of the organic light-emitting display device. The backplate 163 may correspond in shape to the flexible substrate 120 to which the backplate 163 is attached. The mesh pattern 165 may be formed to be inserted inside the backplate 163. For example, the mesh pattern 165 may be formed using an extrusion method. For example, the mesh pattern 165 may be formed using an extrusion method. However, the mesh pattern 165 may also be formed using other methods of insertion into the inside of the backplate 163.

The mesh pattern 165 may be made of a material having a relatively higher elastic modulus compared to the backplate 163. The elastic modulus is defined as a proportional constant or coefficient that characterizes the resistance to elastic deformation, and materials with lower elastic modulus are classified as more ductile or compliant, while materials with higher elastic modulus are classified as more rigid. A material with a high elastic modulus has a low deformation ratio. Specifically, the deformation ratio (δ) is defined as follows.

$$\delta=(P*l)/(A*E)$$

Here, P represents the applied force (kgf or N), 1 represents the length of the material (m), A represents the cross-sectional area of the material ($m^2$), and E represents the elastic modulus (GPa). The deformation ratio and elastic modulus are inversely proportional.

As described above, according to the present disclosure, there is an issue of the support film 160 undergoing stretching during the process of attaching the support film 160 at step S116 due to the compression force applied by the roller (R). The stretching issue of the support film 160 is closely connected to the stretching of the flexible substrate 120 and other components that are attached using the adhesive layer 162. The stretching problem of the flexible substrate 120 leads to the misalignment issue between the desired positions of the subsequently attached polarizing plate and flexible printed circuit board. According to the present disclosure, by inserting a mesh pattern 165 inside the backplate 163 and using a material with a relatively high elastic modulus (i.e., low deformation ratio) for the mesh pattern 165, it is possible to eliminate or minimize the stretching issue of the support film 160. As a result, it is possible to eliminate or minimize the misalignment problem between the polarizing plate and the flexible printed circuit board.

For example, the mesh pattern 165 may be made of cotton material. The elastic modulus of cotton is approximately 8.0 GPa. The backplate 163 may be made of polyethylene terephthalate (PET) material of which elastic modulus is approximately 3.7 GPa. According to the present disclosure, the elastic modulus of the backplate 163 with the mesh pattern 165 may be approximately 8.0 GPa. Therefore, compared to the backplate 163 formed without the mesh pattern 165, the elastic modulus increases from 3.7 GPa to 8.0 GPa. The increased elastic modulus allows for a reduction in the stretching rate (or deformation ratio) of the support film 160.

For example, the mesh pattern 165 may be made of metal material. Typically, the elastic modulus of metals is higher compared to that of PET. For example, the mesh pattern 165 may be made of copper material. The elastic modulus of copper is approximately 48 GPa, which is significantly high. The elastic modulus of a backplate 163 made of PET material is approximately 3.7 GPa. According to the present disclosure, by inserting a mesh pattern 165 made of copper into the backplate 163, the elastic modulus of the backplate 163 increases to approximately 48 GPa.

Particularly when the mesh pattern 165 is made of a metal material, it is possible to improve the heat dissipation performance of the organic light-emitting display device. According to the present disclosure, the support film 160 is attached over the entire surface of the flexible substrate 120. Heat may be generated during the operation of components, such as transistors, located on top of the flexible substrate 120. According to the present disclosure, when the mesh pattern 165 is made of a metal material, it may facilitate the dispersion of heat generated due to the high thermal conductivity of the metal.

Figure 9:
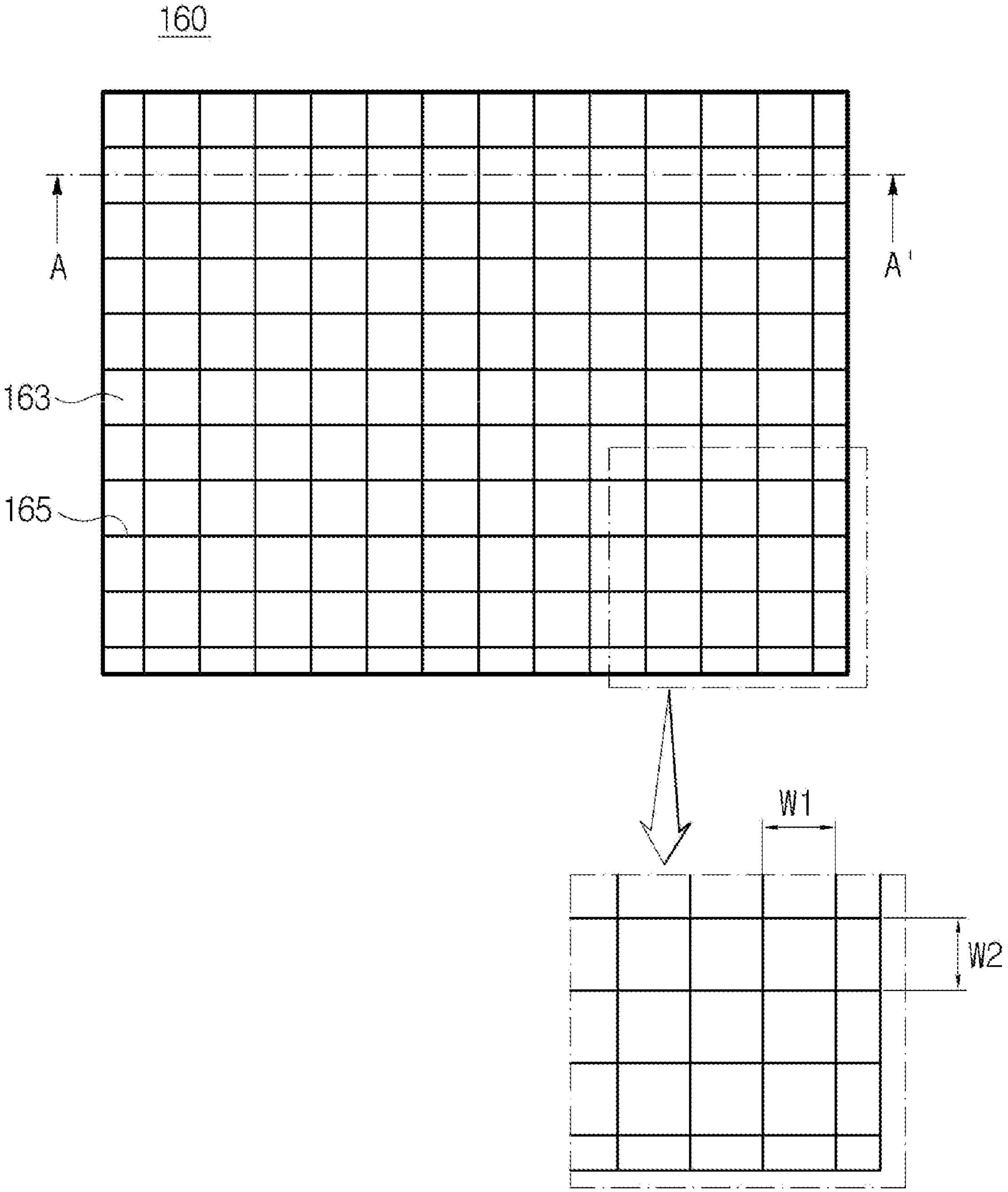
FIG. 9 is a plan view illustrating a support film according to the present disclosure.

With reference to the plan view of FIG. 9, the mesh pattern 165 may have an elongated shape extending in the horizontal and vertical directions of the backplate 163. Therefore, the mesh pattern 165 may be formed in a rectangular pattern where an identical rectangle repeats in both the horizontal and vertical directions. The horizontal width W1 of the rectangle may range from 0.2 mm to 0.3 mm, and the vertical width W2 may also range from 0.2 mm to 0.3 mm.

Figure 10:
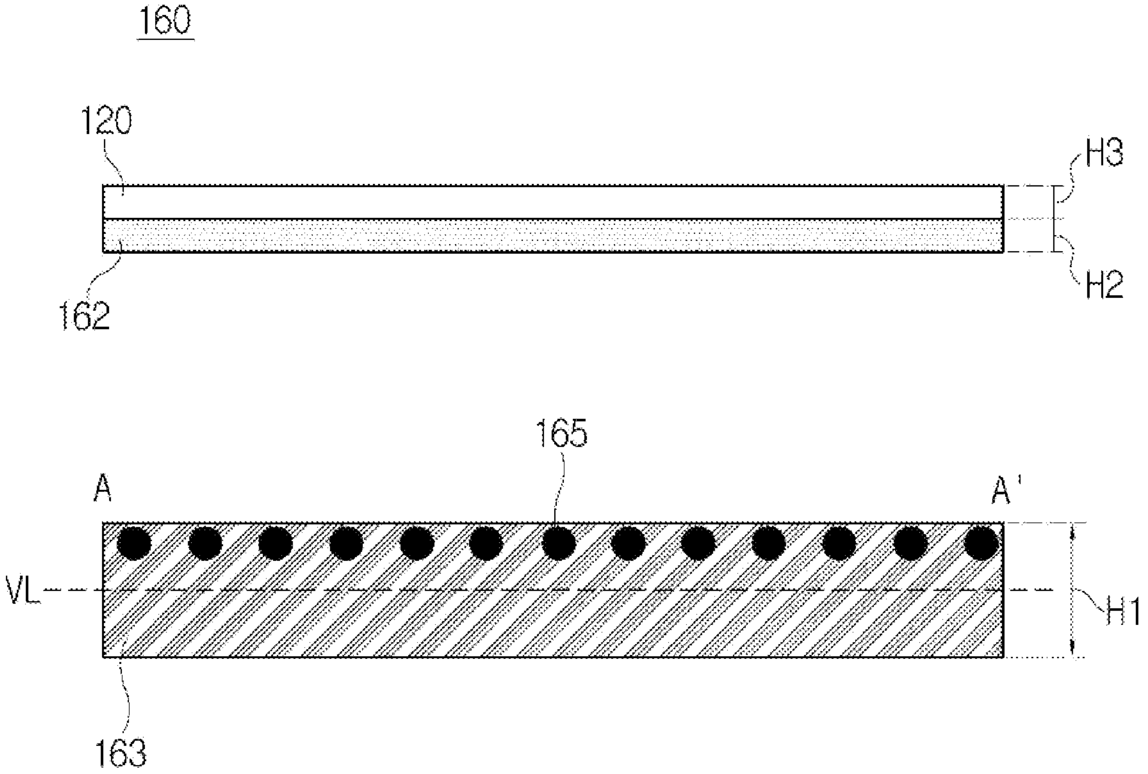
FIG. 10 is a cross-sectional view illustrating a support film according to the present disclosure.

The cross-sectional view of FIG. 10 is referred. FIG. 10 is a cross-sectional view taken along A-A line in the plan view of FIG. 9.

The support film 160 includes the backplate 163, and the mesh pattern 165 is inserted inside the backplate 163. The mesh pattern 165 may have a circular cross-section as an example. The diameter of the cross-section of the mesh pattern 165 may be 0.005 mm or even smaller.

The height H1 of the cross-section of the backplate 163 may be 0.125 mm.

The adhesive layer 162 is disposed on top of the backplate 163. The height H2 of the cross-section of the adhesive layer 162 may be 0.025 mm.

The flexible substrate 120 is disposed on top of the adhesive layer 162. The height of the cross-section of the flexible substrate 120 may be 0.044 mm.

The notable point is that the mesh pattern 165 is inserted into the backplate 163 in a position closer to the flexible substrate 120 when viewed from a cross-sectional perspective. In detail, the mesh pattern 165 is inserted into the backplate 163, biased towards the surface that is closer to the flexible substrate 120, with reference to an imaginary line (VL) that crosses the center of the backplate's cross-section. With reference to FIG. 10, the flexible substrate 120 is attached to the upper surface of the backplate 163 using the adhesive layer 162. The mesh pattern 165 is disposed in the upper half portion with respect to the imaginary line VL. As mentioned earlier, the present disclosure introduces the mesh pattern 165 to address the stretching issue of the flexible substrate 120. Accordingly, the optimal position for the mesh pattern 165, to minimize the stretching of the flexible substrate 120, is in close proximity to the flexible substrate 120.

Also, the mesh pattern 165 may be fully inserted inside the backplate 163. When the mesh pattern 165 is not fully inserted inside the backplate 163 and protrudes outward, the bonding strength between the flexible substrate 120 and the backplate 163 may be weakened.

Meanwhile, according to the present disclosure, the insertion of the mesh pattern 165 may lead to the issue of the mesh pattern being visible to the naked eye on the front of the organic light-emitting display device. To address the issue of the mesh pattern 165 being visible to the naked eye from the front of the organic light-emitting display device, the adhesive layer 162 positioned on the top of the backplate 163 may be composed of a substance including pigments capable of blocking light. For example, the pigments may include one of black ink and carbon. For example, the adhesive layer 162 may be composed of black pressure-sensitive adhesive (PSA).

Figure 11:
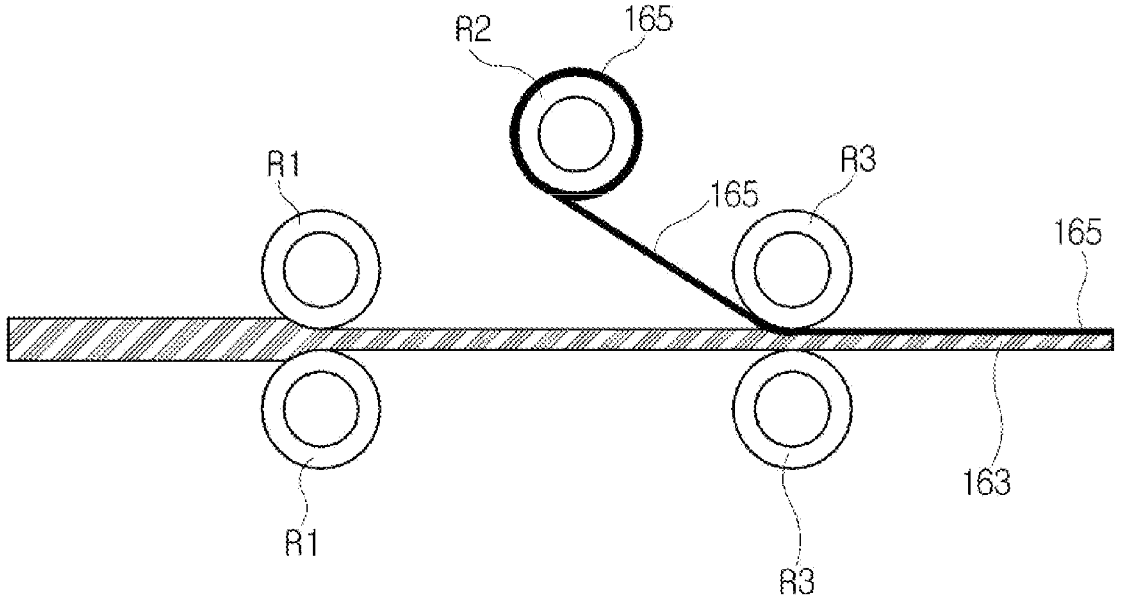
FIG. 11 is a diagram illustrating a method of manufacturing a support film according to the present disclosure.

A description is made of the exemplary process of inserting the mesh pattern 165 into the backplate 163 according to the present disclosure with reference to FIG. 11. FIG. 11 is a diagram illustrating the process of extruding the mesh pattern 165 onto the backplate 163.

With reference to FIG. 11, the transfer roller (R1) rotates to move the backplate 163. The mesh pattern 165 is wound on the release roller (R2), and as the release roller (R2) rotates, the mesh pattern 165 is released. The backplate 163 and the mesh pattern 165 are sandwiched between the two compression rollers R3. The compression rollers R3 rotate while tightly compressing the backplate 163 that is being transported by the transfer roller R1. The mesh pattern 165 may be embedded into the interior of the backplate 163.

FIG. 11 illustrates an extrusion method employed according to an aspect the present disclosure. In addition to the method illustrated in FIG. 11, there are alternative methods that may be employed to insert the mesh pattern 165 into the interior of the backplate 163. For example, an injection molding method may also be used. The present disclosure is not limited to the aforementioned insertion methods.

Figure 12:
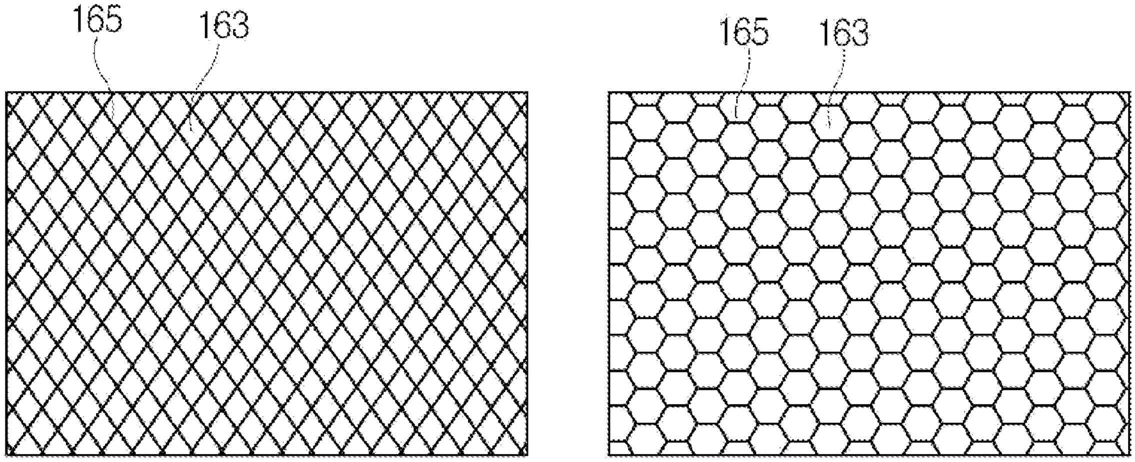
FIG. 12 is a diagram illustrating different shapes of a support film according to the present disclosure.

In the above description, the mesh pattern 165 is described and depicted as a rectangular mesh pattern. However, the mesh pattern 165 according to the present disclosure may have a different shape. For example, the mesh pattern 165 may also be formed as a diamond mesh pattern as shown in FIG. 12. The mesh pattern 165 may also be formed as a hexagonal mesh pattern as shown in FIG. 12.

With reference to FIG. 1, the support film 160 is scribed to form a bending area BA at step S121.

Figure 13:
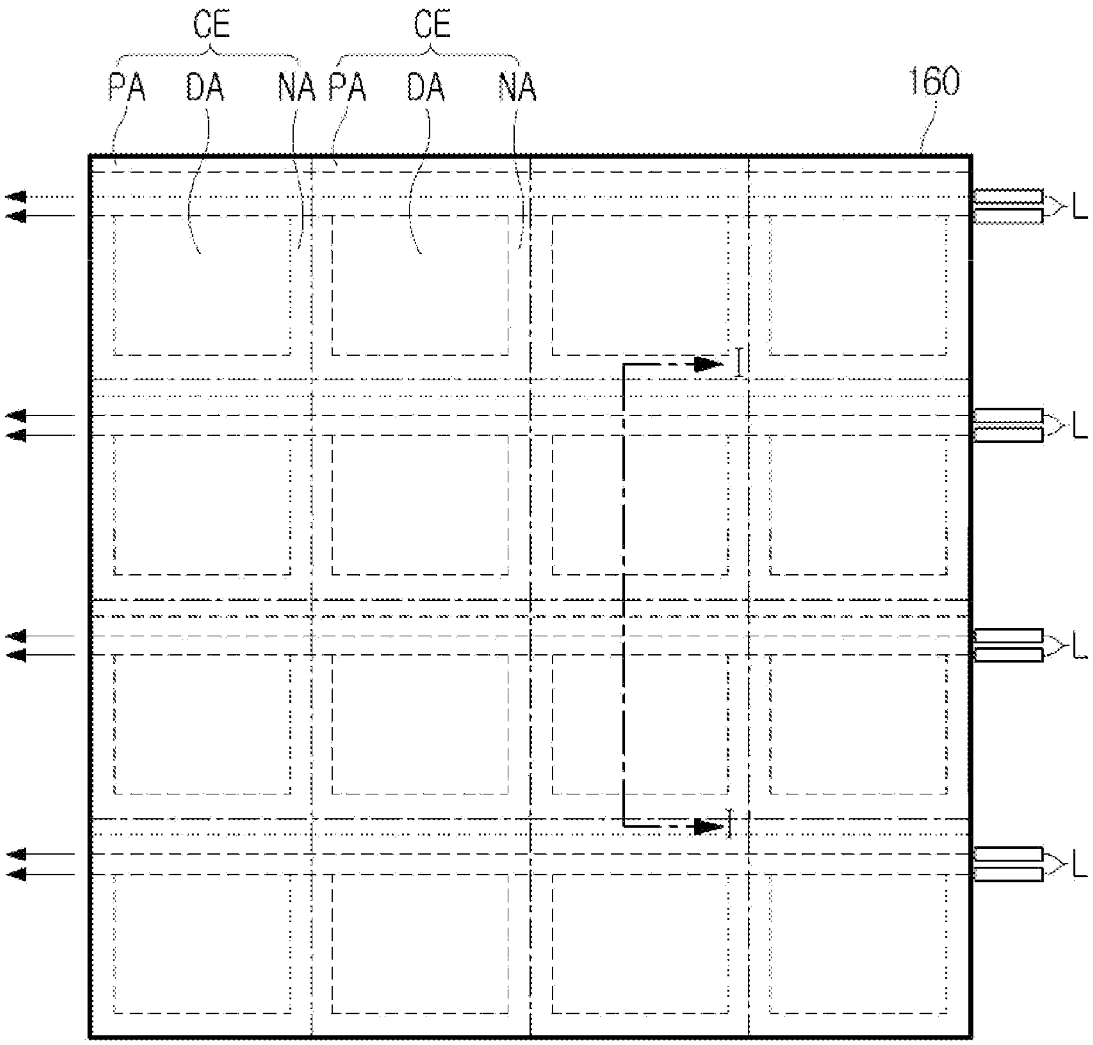
FIG. 13 is a plan view illustrating an organic light-emitting display device according to an aspect of the present disclosure.
Figure 14:
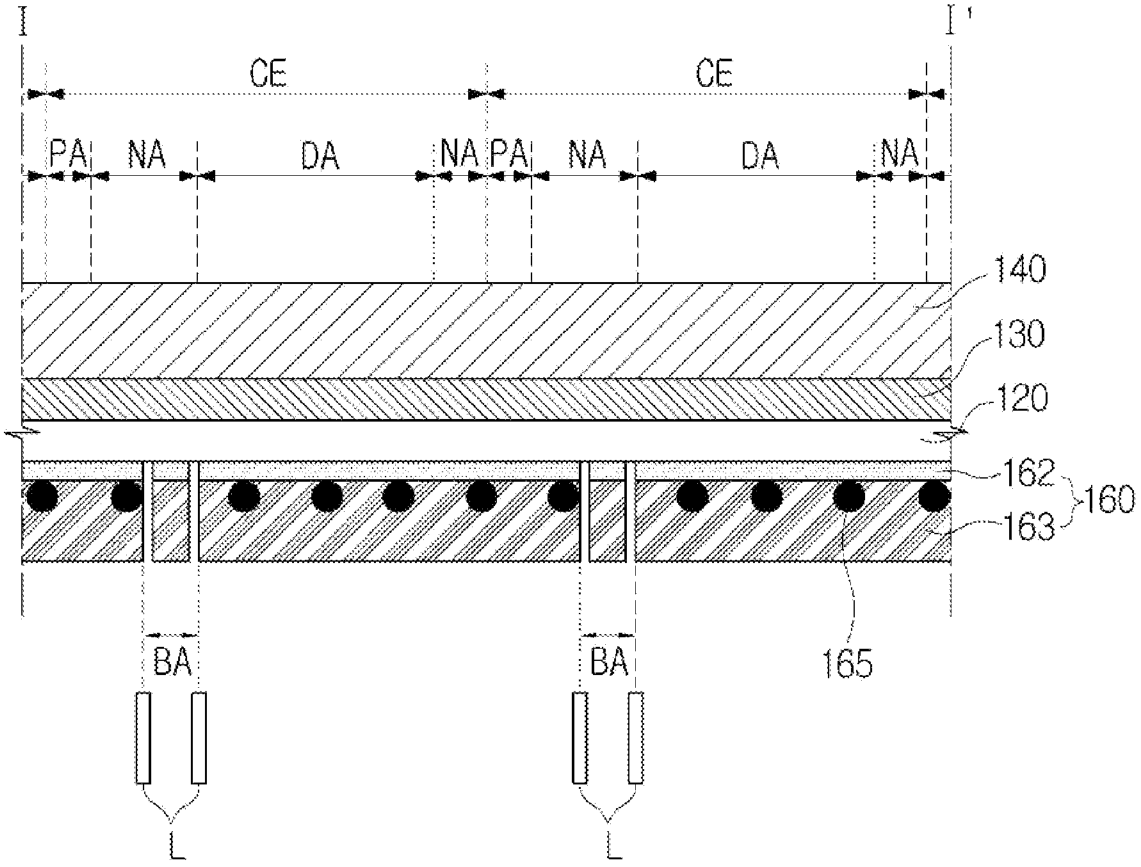
FIG. 14 is a cross-sectional view illustrating an organic light-emitting display device according to the present disclosure.

In detail, with reference to FIGS. 13 and 14, a laser L irradiate the laser onto the support film 160 at positions corresponding to the boundaries of the bending area BA. The bending area BA is a portion of the non-display area NA of an organic light-emitting display device, and it refers to the area where modules such as flexible circuit boards, flexible printed circuit boards, etc., are placed on one side of the organic light-emitting display device, are bent to be positioned on the backside of the flexible substrate 120. The bending area BA is positioned between the display area DA and the pad area PA.

With reference to FIGS. 13 and 14, the laser L may irradiate laser to the support film 160, while moving along the boundaries of the bending area BA. As shown in FIG. 13, the laser L may irradiate laser, while moving in the direction indicated by the arrow from right to left. The laser L may be a laser used for irradiating UV light.

Figure 15:
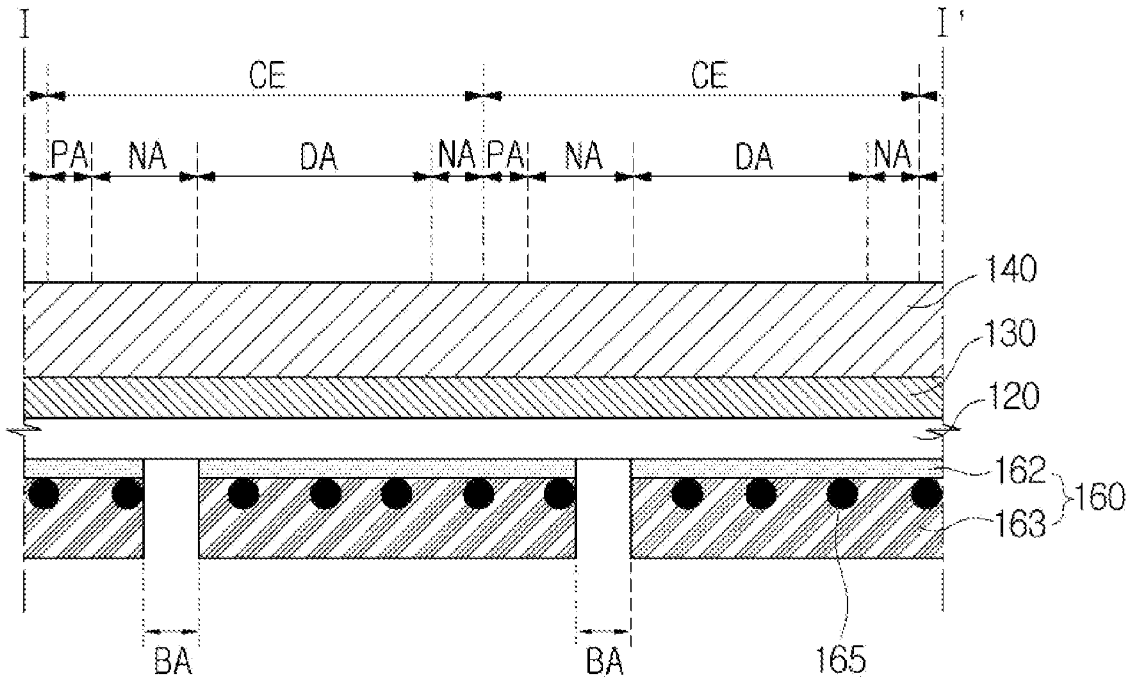
FIG. 15 is a cross-sectional view illustrating an organic light-emitting display device according to the present disclosure.

With reference to FIG. 15, the support film 160 is removed at the portion corresponding to the bending area BA. As the support film 160 is partially removed corresponding to the bending area BA, the flexible substrate 120 may become more bendable, facilitating the bending process.

With reference to FIG. 1, the protective film 140 is scribed at step S122.

Figure 16:
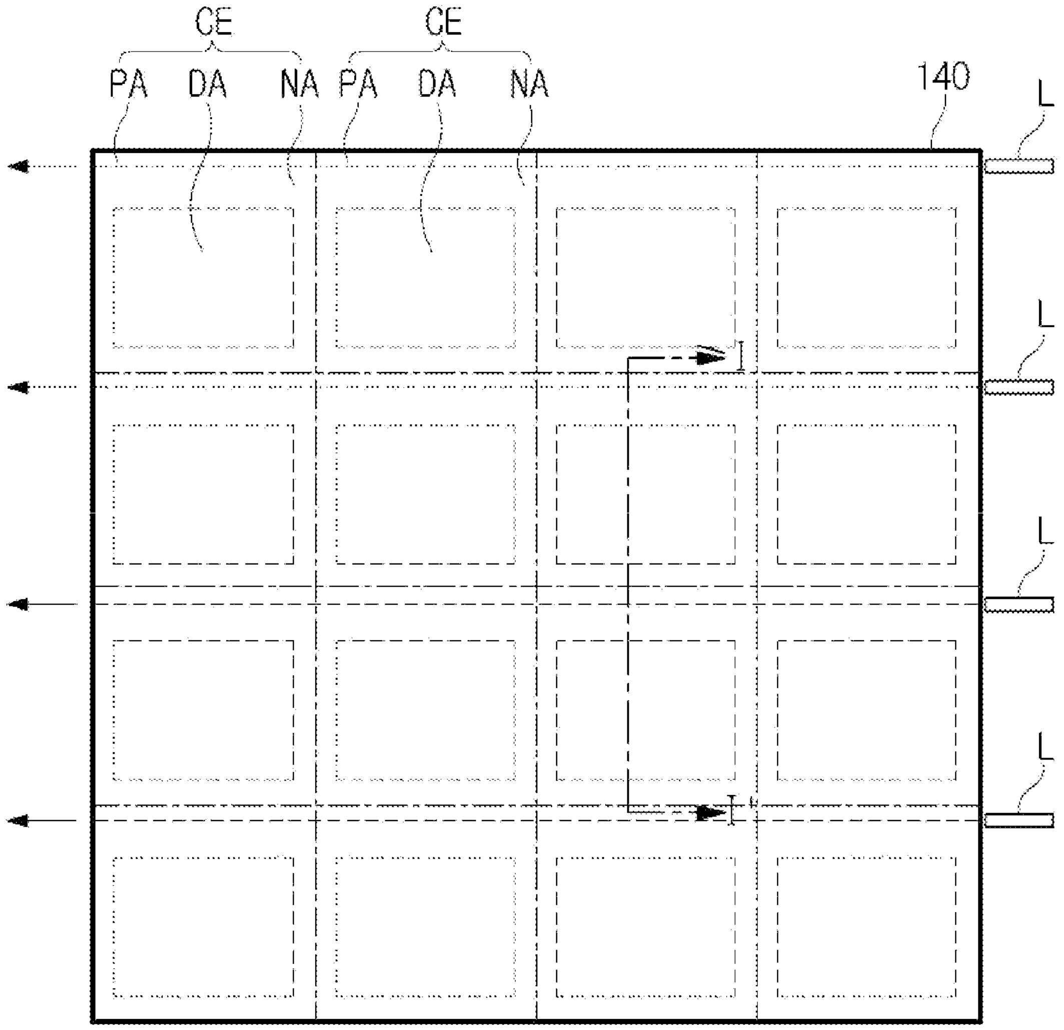
FIG. 16 is a plan view illustrating an organic light-emitting display device according to an aspect of the present disclosure.
Figure 17:
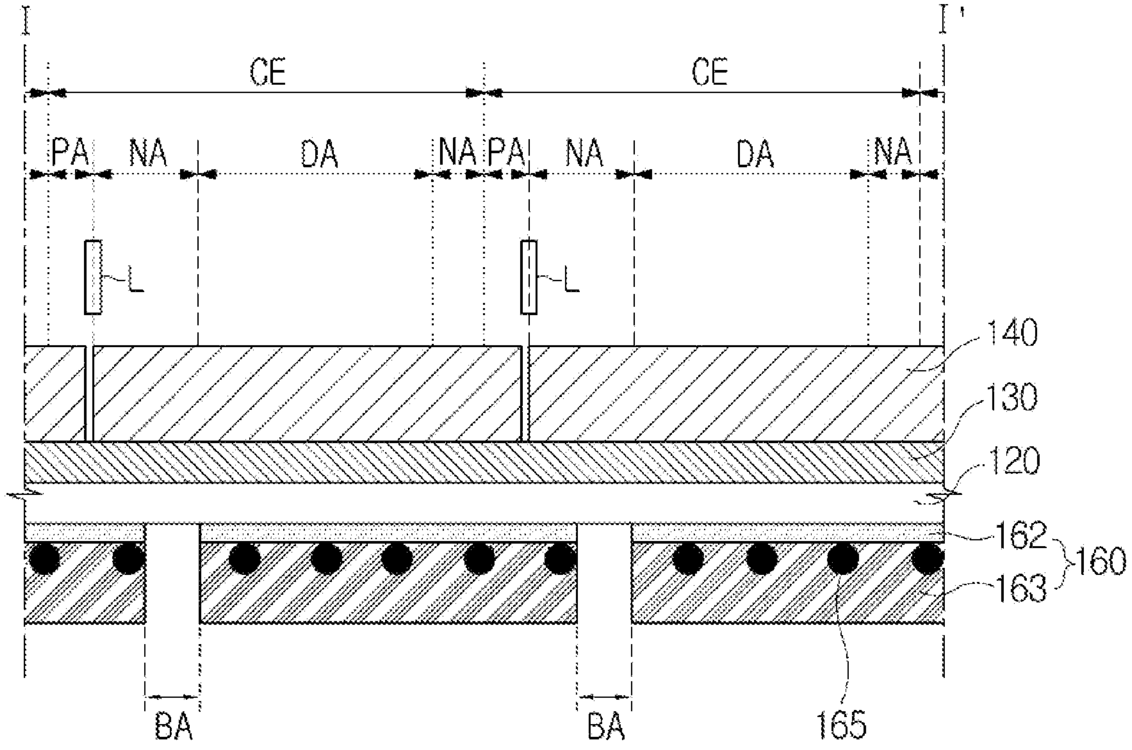
FIG. 17 is a cross-sectional view illustrating an organic light-emitting display device according to the present disclosure.

In detail, with reference to FIGS. 16 and 17, a laser L irradiates the laser at the boundaries between the non-display area NA and the pad area PA. The laser L may be moved along the boundaries between the non-display area NA and the pad area PA on the protective film 140, while irradiating light at the boundaries of the non-display area NA and the pad area PA. That is, the laser L may move in the direction indicated by the arrow from right to left on the protective film 140, while irradiating light at the boundaries between the non-display area NA and the pad area PA. For example, the laser L may be used for irradiating ultraviolet (UV) light. By irradiating the laser at the boundaries between the non-display area NA and the pad area PA, the protective film 140 may be scribed at the portions corresponding to the boundaries of the non-display area NA and the pad area PA as shown in FIG. 17. For example, by adjusting parameters such as the intensity of the laser irradiated from the laser L and the irradiation time, it is possible to scribe only the protective film 140 while minimizing damage to other components.

With reference to FIG. 1, a scribing process is performed in units of multiple cells at step S123.

Figure 18:
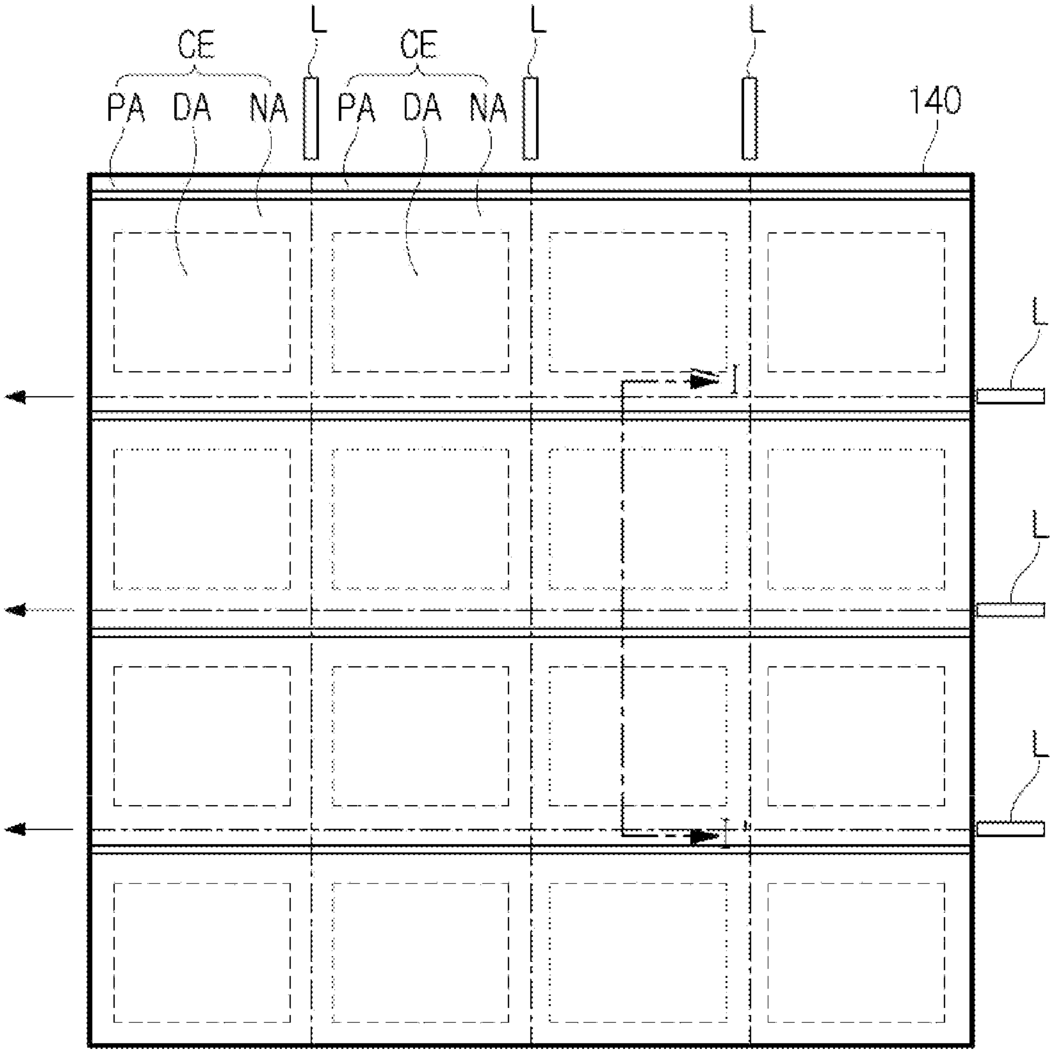
FIG. 18 is a plan view illustrating an organic light-emitting display device according to an aspect of the present disclosure.
Figure 19:
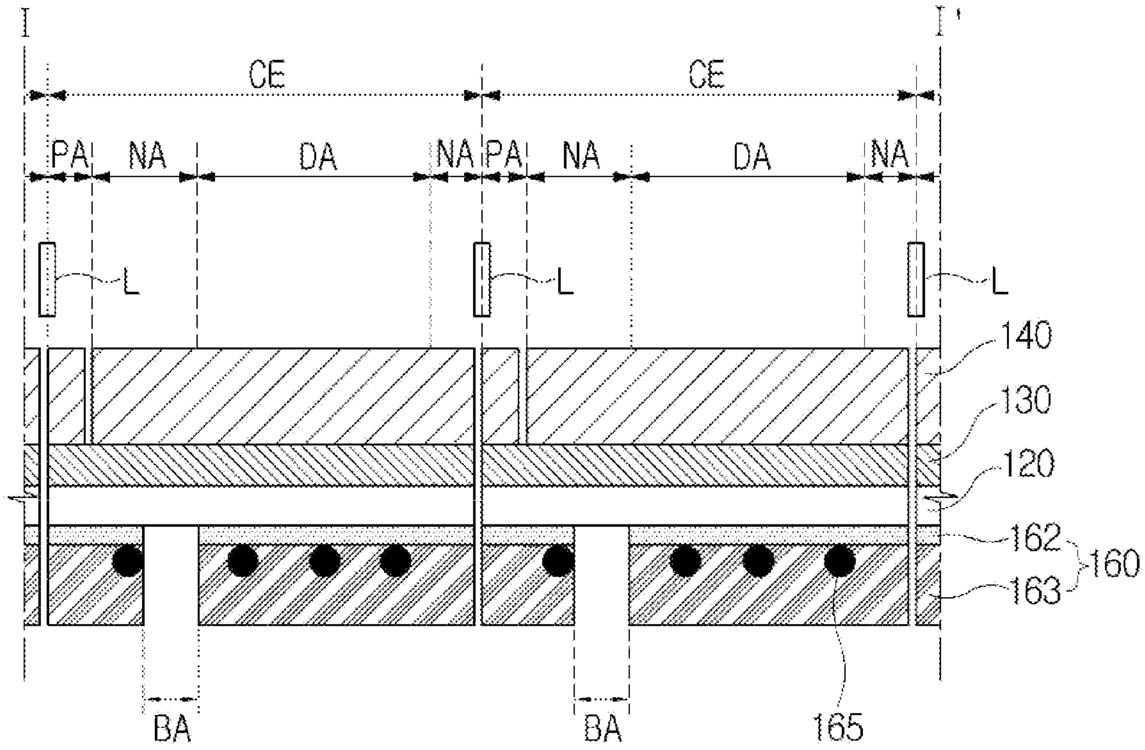
FIG. 19 is a cross-sectional view illustrating an organic light-emitting display device according to the present disclosure.

In detail, with reference to FIGS. 18 and 19, the laser L irradiates laser at the boundaries of multiple cells CE. The laser L may move along the boundaries of multiple cells CE on the protective film 140, while irradiate light at the boundaries of multiple cells CE. The laser L may move from the top to the bottom of the protective film 140, while irradiating light at the boundaries of multiple cells CE as shown in FIG. 18. The laser L may also move from right to left on the protective film 140, while irradiating light at the boundaries of multiple cells CE. As an example, the laser L may be a laser used for irradiating UV light. By irradiating light at the boundaries of multiple cells CE, it is possible to scribe the protective film 140, pixel array layer 130, and support film 160 in units of multiple cells CE, as shown in FIG. 19.

With reference to FIG. 1, the protective film 140 is removed at step S124.

Figure 20:
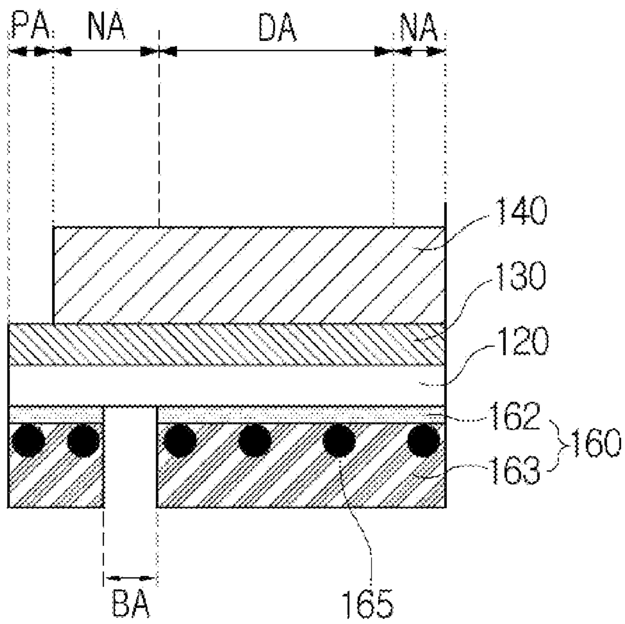
FIG. 20 is a cross-sectional view illustrating an organic light-emitting display device according to the present disclosure.
Figure 21:
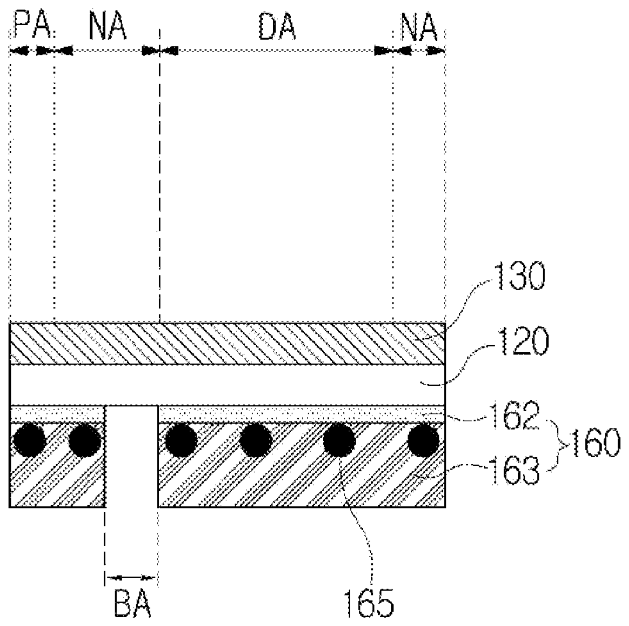
FIG. 21 is a cross-sectional view illustrating an organic light-emitting display device according to the present disclosure.

In detail, with reference to FIG. 20, the protective film 140 is positioned on top of the pixel array layer 130 before the protective film 140 is removed. With reference to FIG. 21, the protective film 140 is removed, exposing the entire pixel array layer 130. With reference to FIGS. 20 and 21, only one organic light-emitting display device corresponding to a single cell CE is depicted. Additionally, dry cleaning may be performed on the pad area PA. In detail, dry cleaning may be carried out by introducing air through a dry cleaning apparatus. Through dry cleaning, contaminants or foreign substances present in the pad area PA may be easily removed. Considering that the organic light-emitting components in the pixel array layer 130 are vulnerable to moisture, dry cleaning may prevent damage to the components caused by moisture during the cleaning process. In addition, an illumination test may be performed through the pad electrodes located in the pad area PA. The illumination test may be performed using a probe or the like on the pad electrodes located in the pad area PA. In addition, other tests may also be conducted to verify the proper functioning of the organic light-emitting display device.

With reference to FIG. 1, a polarizing plate 150 is attached onto the pixel array layer 130 at step S131.

Figure 22:
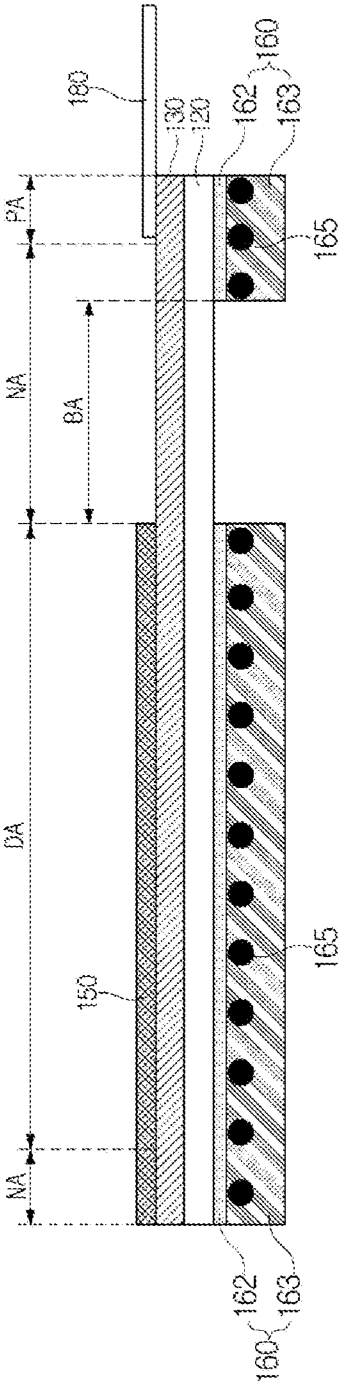
FIG. 22 is a cross-sectional view illustrating an organic light-emitting display device according to the present disclosure.

In detail, with reference to FIG. 22, a polarizing plate 150 is disposed on top of the pixel array layer 130. On the back surface of the polarizing plate 150, an adhesive layer such as OCA may be applied. The polarizing plate 150 may be attached to the top surface of the pixel array layer 130 via the adhesive layer. FIG. 22 is a cross-sectional view depicting the components in a more realistic proportion compared to the previous diagrams, the proportions of the components have been adjusted.

With reference to FIG. 1, a flexible printed circuit board is attached at step S132.

In detail, with reference to FIG. 22, a flexible printed circuit board 180 is positioned in the pad area PA of the flexible substrate 120. The flexible printed circuit board 180 is a flexible circuit board made of a flexible material base film, on which chips such as driving integrated circuits (ICs) are mounted. Although it is described as a flexible circuit board in the description made with reference to FIG. 22, the flexible printed circuit board 180 is not limited thereto and may be other types of board having a rigidity.

With reference to FIG. 1, a micro cover layer is applied at step S141.

Figure 23:
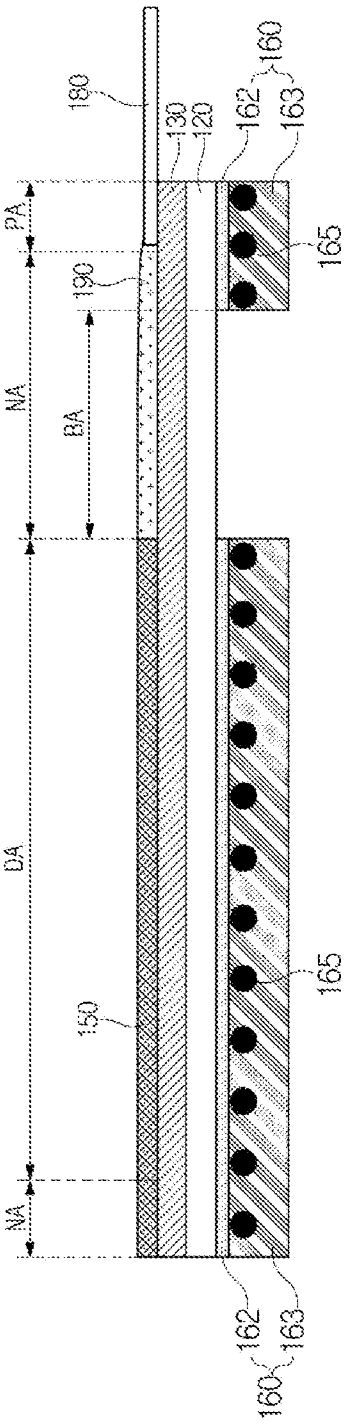
FIG. 23 is a cross-sectional view illustrating an organic light-emitting display device according to the present disclosure.

In detail, with reference to FIG. 23, the micro cover layer 190 is applied to cover the bending area BA on the top surface of the flexible substrate 130. The micro cover layer 190 is an insulating layer that is positioned in the bending area BA to reduce the stress on various wirings and insulating layers located in that area. That is, by placing the micro cover layer 190 in the bending area BA, it is possible to adjust the position of the neutral plane in the bending area BA, allowing the wiring and insulating layers, which may experience stress during bending, to be positioned as close as possible to the neutral plane of the bending area BA. As a result, the risk of cracking to the wiring and insulating layer may be minimized when the bending area BA is bent.

With reference to FIG. 1, trimming is performed at step S142.

Figure 24:
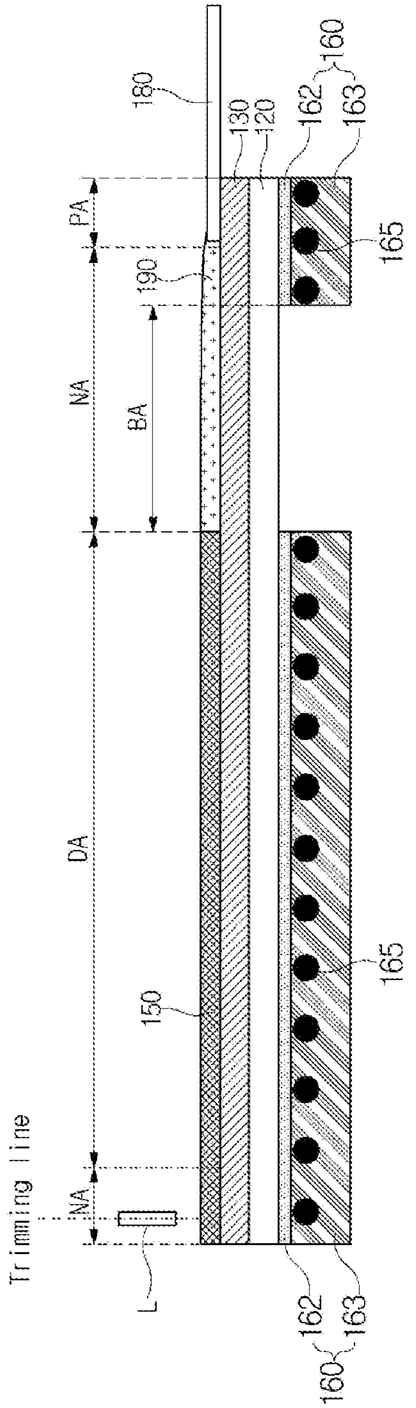
FIG. 24 is a cross-sectional view illustrating an organic light-emitting display device according to the present disclosure.

In detail, with reference to FIG. 24, the laser L irradiates light from the top to the bottom of the polarizing plate 150 to trim the organic light-emitting display device. For example, when applying an organic light-emitting display device to a product with a form factor like a smartwatch, it may be necessary to modify the shape of the flexible substrate 120 to fit the form factor of the corresponding product. For example, a laser trimming process may be performed to round the edges of the flexible substrate 120. As a result, the corners of the organic light-emitting display device may be trimmed to match the desired shape.

With reference to FIG. 1, the organic light-emitting display device is bent at step S143.

Figure 25:
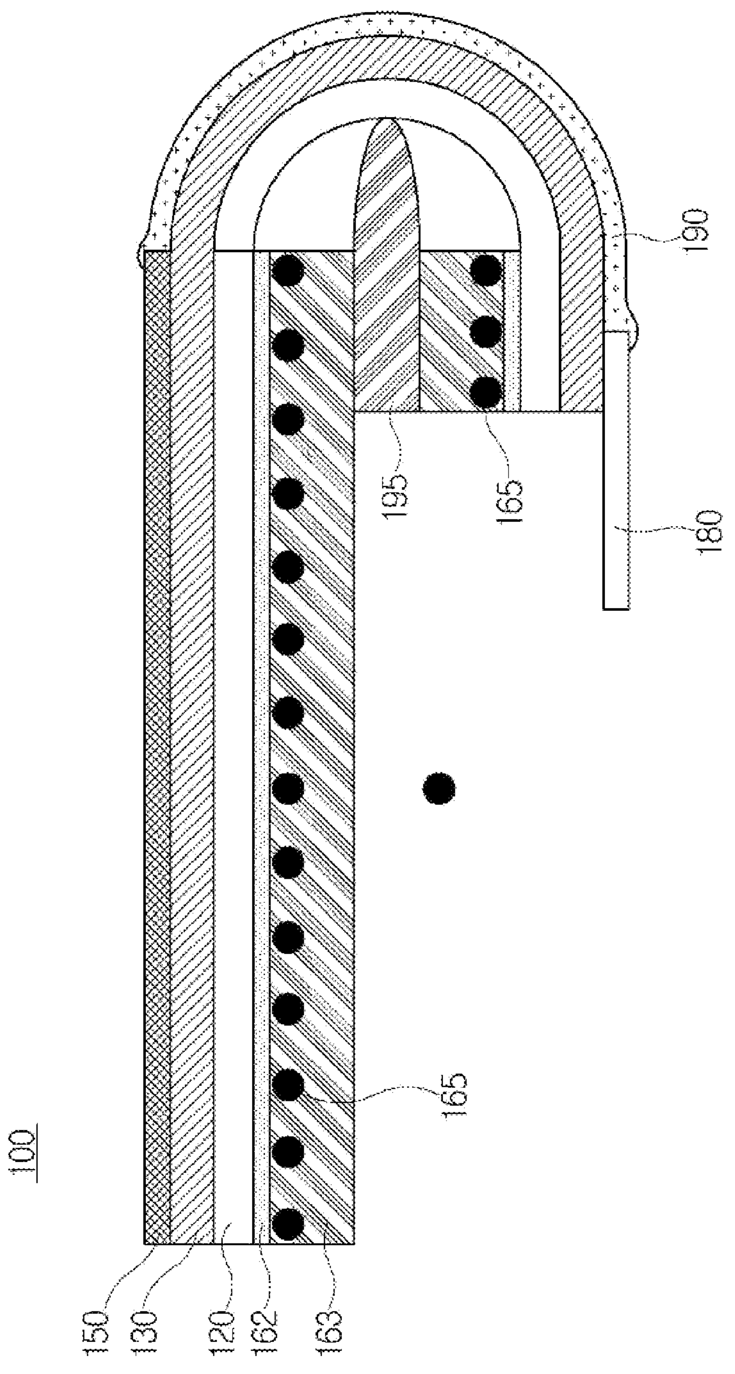
FIG. 25 is a cross-sectional view illustrating an organic light-emitting display device according to the present disclosure.

In detail, with reference to FIG. 25, a supporting material 195 may be used to define the curvature of the organic light-emitting display device 100. The organic light-emitting display device 100 is bent in such a way that the upper and lower surfaces of the supporting material 195 contact a backplate 163. The flexible substrate 120 may contact one end of the supporting material 195. Afterward, a cover window may be attached to the top surface of the polarizing plate 150. The cover window may serve as a component to protect the organic light-emitting display device 100 from external impacts. For example, the cover window may be a film-type material made of organic substances such as polymethylmethacrylate (PMMA), polycarbonate (PC), cycloolefin polymer (COP), polyethylene terephthalate (PET), polyimide (PI), or polyaramid (PA) with impact resistance and optical transparency or made of inorganic materials such as glass or sapphire. The cover window may be attached using an adhesive member such as OCA. The adhesive member like OCA may be composed of acrylic-based resins, polyacrylate-based resins, vinyl resins, styrene resins, ester-based resins, rubber-based resins, epoxy-based resins, polyimide resins, polyurethane resins, or the like.

With reference to FIG. 25, the organic light-emitting display device according to the present disclosure includes a flexible substrate 120, a pixel array layer 130 disposed on the upper surface of the flexible substrate, and an adhesive layer 162 and a backplate 163 that are disposed on the lower surface of the flexible substrate. A mesh pattern 165 is inserted into the backplate 163. The adhesive layer 162, backplate 163, and mesh pattern 165 may be collectively referred to as a support film 160.

A polarizing plate 150 is positioned on the upper surface of the pixel array layer 130. A flexible printed circuit board 180 is attached to the pad area on the upper surface of the pixel array layer 130.

As described above, the elastic modulus of the mesh pattern 165 may be higher than that of the backplate 163. For example, when the backplate 163 is made of PET material, the elastic modulus may be approximately 3.7 GPa. The mesh pattern 165 may be made of cotton material, and in such a case, the elastic modulus of the mesh pattern 165 may be approximately 8.0 GPa. The mesh pattern 165 may be made of copper as a type of metal, and in such a case, the elastic modulus of the mesh pattern 165 may be approximately 48 GPa.

As described above, the mesh pattern 165 may be formed to have a repeating pattern element in the horizontal and vertical directions of the backplate 163. The mesh pattern 165 may be formed with rectangles, but is not limited thereto. For example, the mesh pattern 165 may be of a polygon such as a rectangle, diamond, or hexagon.

The mesh pattern 165 is formed into the backplate 163 in a position close to the surface facing the flexible substrate 120 when viewed from a cross-sectional perspective. As described with reference to FIG. 10, the mesh pattern 165 may be inserted into the backplate 163 in a position closer to the surface facing the flexible substrate 120, with reference to a virtual line VL. Also, the mesh pattern 165 may be fully inserted into the interior of the backplate 163. In other words, the mesh pattern 165 may be inserted into the backplate 163 without protruding outward.

As described above, the adhesive layer 162 may be made of a PSA material. When the adhesive layer 162 is made of a PSA material and the support film 160 is attached with a roller, a lateral stretching problem may arise. As described above, inserting the mesh pattern 165 inside the backplate 163 may help alleviate the stretching problem. To address the issue of the mesh pattern 165 being visible to the naked eye, the adhesive layer 162 may contain light-blocking pigments. The light-blocking pigments may include, for example, black ink or carbon. Accordingly, the adhesive layer 162 may be a black PSA.

Figure 26:
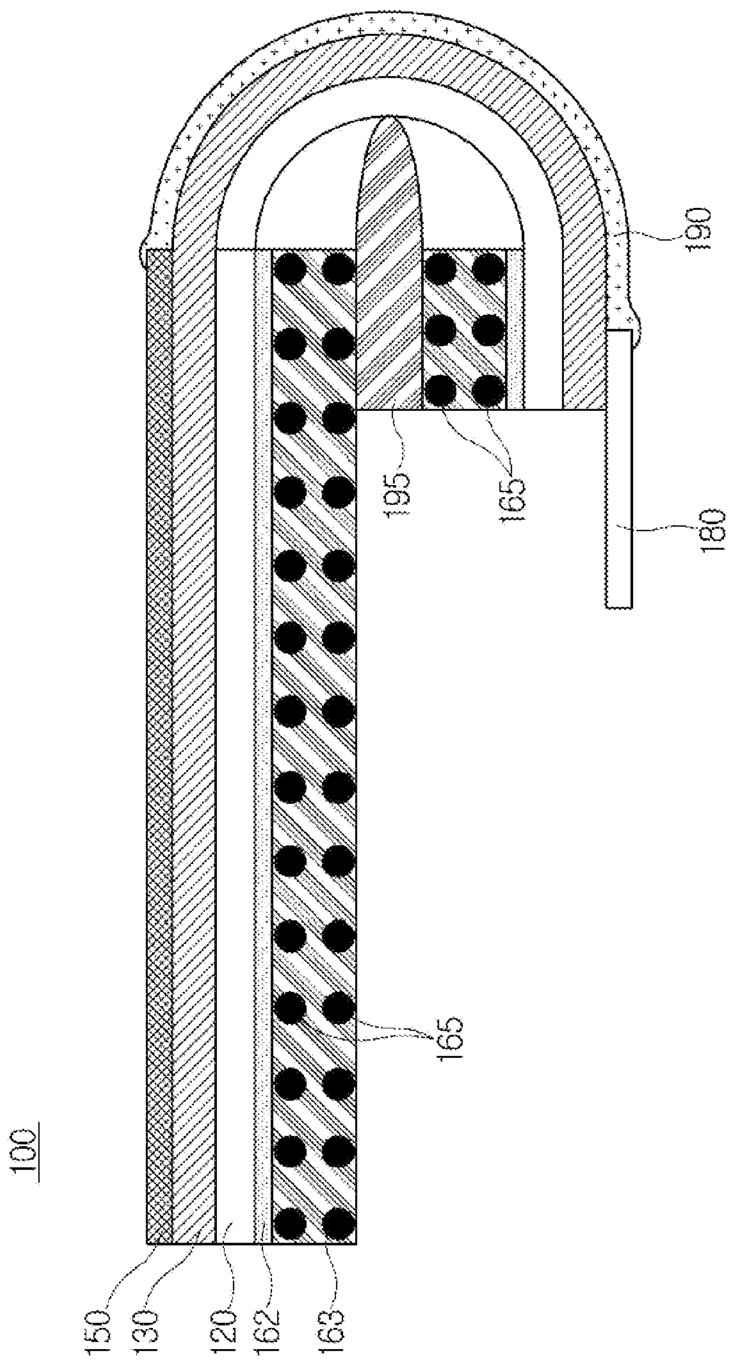
FIG. 26 is a cross-sectional view illustrating an organic light-emitting display device according to the present disclosure.

FIG. 26 is a diagram illustrating an organic light-emitting display device according to another aspect of the present disclosure.

With reference to FIG. 26, the organic light-emitting display device according to another aspect of the present disclosure differs from the aspect of FIG. 25 in that the mesh pattern 165 is double-layered.

In detail, the organic light-emitting display device includes a flexible substrate 120, a pixel array layer 130 disposed on the upper surface of the flexible substrate, an adhesive layer 162 and a backplate 163 both disposed on the lower surface of the flexible substrate. The double-layered mesh pattern 165 is inserted into the interior of the backplate 163. The adhesive layer 162, backplate 163, and the double-layered mesh pattern 165 may be collectively referred to as a support film 160.

A polarizing plate 150 is positioned on the upper surface of the pixel array layer 130. A flexible printed circuit board 180 is attached to the pad area on the upper surface of the pixel array layer 130.

As described above, the elastic modulus of the mesh pattern 165 may be higher than that of the backplate 163. For example, when the backplate 163 is made of PET material, the elastic modulus may be approximately 3.7 GPa. The mesh pattern 165 may be made of cotton material, and in such a case, the elastic modulus of the mesh pattern 165 may be approximately 8.0 GPa. The mesh pattern 165 may be made of copper as a type of metal, and in such a case, the elastic modulus of the mesh pattern 165 may be approximately 48 GPa.

As described above, the mesh pattern 165 may be formed to have a repeating pattern element in the horizontal and vertical directions of the backplate 163. The mesh pattern 165 may be formed with rectangles, but is not limited thereto. For example, the mesh pattern 165 may be of a polygon such as a diamond and hexagon.

The mesh pattern 165 may be formed as a double layer in the cross-section of the backplate 163. Therefore, one layer of mesh pattern 165 may be formed close to the surface facing the flexible substrate 120. The other layer of the mesh pattern 165 may be formed close to the surface farther from the flexible substrate 120. As described with reference to FIG. 10, the flexible substrate 120 may be inserted into the backplate 1630 in such a way that one layer is positioned on the side close to the flexible substrate 120, with respect to the imaginary line VL, while the other layer is positioned on the side farther from the flexible substrate 120. Also, the mesh pattern 165 may be fully inserted into the interior of the backplate 163. In other words, the mesh pattern 165 may be inserted into the backplate 163 without protruding outward.

As described above, the adhesive layer 162 may be made of a PSA material. When the adhesive layer 162 is made of a PSA material and the support film 160 is attached with a roller, a lateral stretching problem may arise. As described above, inserting the mesh pattern 165 inside the backplate 163 may help alleviate the stretching problem. To address the issue of the mesh pattern 165 being visible to the naked eye, the adhesive layer 162 may contain light-blocking pigments. The light-blocking pigments may include, for example, black ink or carbon. Accordingly, the adhesive layer 162 may be a black PSA.

A method of manufacturing an organic light-emitting display device according to the present disclosure includes forming a flexible substrate on a mother substrate. The forming of the flexible substrate may include forming a sacrificial layer on the mother substrate as described above at step S111 and forming the flexible substrate on the sacrificial layer as described above at step S112.

A method of manufacturing an organic light-emitting display device according to the present disclosure may include forming a pixel array layer on a flexible substrate. The forming of the pixel array layer may include forming a pixel array layer as described above at step S113 and forming a protective film as described above at step S114.

A method of manufacturing an organic light-emitting display device according to the present disclosure may include separating a mother substrate as described above at step S115.

A method of manufacturing an organic light-emitting display device according to the present disclosure may include attaching a support film including a mesh pattern to a flexible substrate. The attaching of the support film may include forming the support film on the flexible substrate as described above at step S116.

A method of manufacturing an organic light-emitting display device according to the present disclosure may include, after the attaching of the support film, attaching a polarizing plate and a flexible printed circuit board as indicated at steps S131 and S132.

A method of manufacturing an organic light-emitting display device according to the present disclosure may include bending the organic light-emitting display device as described above at step S143.

The above description merely illustrates specific embodiments of the display apparatus.

It will be apparent to those skilled in the art that various modifications and variations can be made in the organic light-emitting display device and the manufacturing method thereof of the present disclosure without departing from the spirit or scope of the aspects. Thus, it is intended that the present disclosure covers the modifications and variations of the aspects provided they come within the scope of the appended claims and their equivalents.

What is claimed is:

1. An organic light-emitting display device comprising:

a flexible substrate including a display area, a bending area, and a pad area;

a pixel array layer disposed on an upper surface of the flexible substrate;

an adhesive layer and a backplate disposed on a lower surface of the flexible substrate;

a polarizing plate disposed on the upper surface of the pixel array layer; and a flexible printed circuit board attached to the pad area, wherein the backplate includes a mesh pattern inserted into an interior thereof, and wherein the mesh pattern is disposed adjacent to the flexible substrate within the backplate to contact the adhesive layer, and a distance between the mesh pattern and the adhesive layer is shorter than a distance between the mesh pattern and a lower surface of the backplate.

2. The organic light-emitting display device of claim 1, wherein the mesh pattern has an elastic modulus higher than that of the backplate.

3. The organic light-emitting display device of claim 1, wherein the mesh pattern is formed of a cotton material.

4. The organic light-emitting display device of claim 1, wherein the mesh pattern is formed of a metal material.

5. The organic light-emitting display device of claim 4, wherein the mesh pattern is formed of a copper material.

6. The organic light-emitting display device of claim 1, wherein the mesh pattern includes a plurality of patterns extending in horizontal and vertical directions of the back plate.

7. The organic light-emitting display device of claim 6, wherein the mesh pattern has a polygonal shape.

8. The organic light-emitting display device of claim 1, wherein the mesh pattern is formed to directly contact the adhesive layer.

9. The organic light-emitting display device of claim 1, wherein the mesh pattern is not protruded outside the backplate.

10. The organic light-emitting display device of claim 1, wherein the adhesive layer comprises a light-blocking pigment.

11. The organic light-emitting display device of claim 1, wherein the mesh pattern is formed of a double layer.

12. A method of manufacturing an organic light-emitting display device, the method comprising:

forming a flexible substrate on a mother substrate;

forming a pixel array layer on the flexible substrate;

separating the mother substrate;

attaching a support film comprising a mesh pattern to the flexible substrate;

attaching, after attaching the support film, a polarizing plate and a flexible printed circuit board; and bending the organic light-emitting display device, wherein the support film comprises an adhesive layer and a backplate, and the mesh pattern is inserted into an interior of the backplate; and wherein the mesh pattern is disposed adjacent to the flexible substrate within the backplate to contact the adhesive layer, and a distance between the mesh pattern and the adhesive layer is shorter than a distance between the mesh pattern and a lower surface of the backplate.

13. The method of claim 12, wherein the attaching of the support film comprises attaching the support film to the flexible substrate using a roller.

14. The method of claim 12, wherein the mesh pattern has an elastic modulus higher than that of the backplate.

15. The method of claim 12, wherein the mesh pattern is formed of a cotton material or a metal material.

16. The method of claim 12, wherein the mesh pattern is formed to directly contact the adhesive layer.

17. The method of claim 12, wherein the mesh pattern is formed of a double layer.

18. The method of claim 12, wherein the adhesive layer includes a black press sensitive adhesive (PSA).

* * * * *